(12) United States Patent
Sato et al.

(10) Patent No.: US 8,319,946 B2
(45) Date of Patent: Nov. 27, 2012

(54) TRANSFER DEVICE

(75) Inventors: Jin Sato, Tokyo (JP); Akira Nakazawa, Tokyo (JP)

(73) Assignee: ORC Manufacturing Co., Ltd., Machida-shi, Tokyo (JP)

( * ) Notice: Subject to any disclaimer, the term of this patent is extended or adjusted under 35 U.S.C. 154(b) by 0 days.

(21) Appl. No.: 13/102,465

(22) Filed: May 6, 2011

(65) Prior Publication Data

US 2011/0204175 A1 Aug. 25, 2011

Related U.S. Application Data

(62) Division of application No. 11/983,292, filed on Nov. 8, 2007, now Pat. No. 7,961,299.

(51) Int. Cl.
| | | |
|---|---|---|
| *B65H 18/08* | (2006.01) | |
| *B65H 20/00* | (2006.01) | |
| *B65H 43/00* | (2006.01) | |
| *G03B 27/32* | (2006.01) | |
| *G03B 27/58* | (2006.01) | |
| *G03B 27/60* | (2006.01) | |

(52) U.S. Cl. ............... 355/72; 226/16; 226/19; 226/35; 242/530.2; 242/538.2; 355/64; 355/73

(58) Field of Classification Search ............... 226/2–3, 226/16, 19–20, 27, 33, 35; 242/342, 520, 242/530–530.2, 536, 538.1–538.2; 250/204–205, 250/548–549, 559.01; 355/50, 53, 64, 72–73, 355/77; 356/399–401
See application file for complete search history.

(56) References Cited

U.S. PATENT DOCUMENTS

| | | | | |
|---|---|---|---|---|
| 4,062,025 | A | * | 12/1977 | Spence-Bate .................. 355/64 |
| 4,164,911 | A | * | 8/1979 | Nicholson ..................... 118/670 |
| 5,168,301 | A | * | 12/1992 | Akisada et al. ................. 355/27 |
| 6,246,462 | B1 | * | 6/2001 | Ackermann et al. ............ 355/32 |
| 6,488,194 | B1 | * | 12/2002 | Couturier ........................ 226/95 |
| 7,961,299 | B2 | * | 6/2011 | Sato et al. ...................... 355/72 |
| 7,969,553 | B2 | * | 6/2011 | Sato et al. ...................... 355/64 |
| 2006/0066715 | A1 | * | 3/2006 | Fukui ............................. 347/262 |
| 2008/0054041 | A1 | * | 3/2008 | Palatzky et al. ................ 226/19 |
| 2009/0059195 | A1 | * | 3/2009 | Sato et al. ...................... 355/53 |
| 2009/0128789 | A1 | * | 5/2009 | Sato et al. ...................... 355/53 |

FOREIGN PATENT DOCUMENTS

| | | | | |
|---|---|---|---|---|
| JP | 04-097 255 | | | 3/1992 |
| JP | 04/156464 | | | 5/1992 |
| JP | 04156465 | A | * | 5/1992 |
| JP | 08-245028 | | | 9/1996 |
| JP | 2003-152026 | | | 5/2003 |

(Continued)

*Primary Examiner* — Hung Henry Nguyen
*Assistant Examiner* — Colin Kreutzer
(74) *Attorney, Agent, or Firm* — Dilworth & Barrese, LLP.

(57) ABSTRACT

The present invention relates to a transfer device that can feed a work in a stable condition without applying it any excess loads. The transfer device for feeding a tape-shaped work to a process stage standing in an upright position, which is placed on one side of the process stage and which includes a supply reel, a take-up reel and a work feeding mechanism. Specifically, the supply reel, around which the work and a protective sheet are wound, is adapted to feed the work and the protective sheet therefrom. The take-up reel is adapted to wind the work and the protective sheet that have been fed from the supply reel, and it is located below the supply reel. The work feeding mechanism is adapted to forward the work from the supply reel to the take-up reel through the process stage.

2 Claims, 13 Drawing Sheets

FOREIGN PATENT DOCUMENTS

| | | |
|---|---|---|
| JP | 2004-193259 | 7/2004 |
| JP | 2005-005586 | 1/2005 |
| JP | 2005005586 A * | 1/2005 |
| JP | 2005-091903 | 4/2005 |
| JP | 2005-093958 | 4/2005 |
| JP | 2005093958 A * | 4/2005 |
| JP | 2005-326550 | 11/2005 |
| JP | 2008028358 A * | 2/2008 |

* cited by examiner

TRANSFER DEVICE

BACKGROUND OF THE INVENTION

1. Field of the Invention

The present invention relates to a transfer device for handling film-shaped works. More specifically, the present invention is directed to a transfer device that feeds a film-shaped work from a supply section to a winding section through a process stage.

2. Description of the Related Art

Generally, as handy electronic devices including portable phones and mobile devices are becoming compact, their electric circuit boards are shrinking. Accordingly, current material sources (or works) for circuit boards tend to shift from a thick hard type to a thin tape-shaped type.

A typical tape-shaped work had a thickness of about 0.1 mm a few years ago, but it is now about 0.06 mm thick. Furthermore, works having a thickness of 0.05 mm or less and a width of 100 mm to 250 mm are highly in demand.

When an electronic circuit board is formed from such a tape-shaped work, the work may be loosened and its side edges may be warped while the work is being fed by a transfer device. In order to overcome this disadvantage, a mechanism of JP2836787 has been known. This mechanism is equipped with a lateral transfer device for allowing a work to be handled stably.

This lateral transfer device is built in an exposure device, and is configured to feed a tape-shaped work for each block laterally in order for the device to transfer patterns on a mask to the surface of the work during an exposure process.

However, if a work is fed laterally, it is likely to be loosened due to its weight. In order to prevent this, a holding mechanism of JP2836787 has been conceived. This holding mechanism has pairs of rollers for pinching a work so as to adjust a tension of the work.

On the other hand, a general transfer device has a curved transfer route and, therefore needs to prevent excess loads from being applied to a work at curved portions. JP2836787 discloses a transfer device equipped with an air dancer for adjusting a tension of a work. With this air dancer, the work can be fed to an exposure stage and fixed there, while the work does not undergo any extra tension.

A typical exposure device (for example, one disclosed by JP2836787) employs a lateral transfer system by which a work is fed laterally, and it is exposed to light in a horizontal position. However, JP-A2005-326550 and JP-A2005-91903 and JP-A2798158 disclose a vertical transfer system for feeding a work vertically in order to increase the patterning resolution by preventing contaminants in the air from being adhered to the surface of the work and/or a mask.

The mechanism of JP-A2005-326550, JP-A2005-91903 or JP2798158 uses rollers for supplying a work to an exposure stage.

In addition, a turning device that curves a feeding route of a work in order to feed the work to a process stage appropriately has been known. An example of such a turning device is disclosed by JP2788207. This turning device floats a work by means of air blown from a jet tip formed on a thin plate on a surface of a fixed shaft, and feeds it at corners.

Typically, a protective sheet having the same size as that of a work is put on a tape, and they are wound around a reel together. This sheet is aimed at preventing contaminants from being adhered to the surface of the work, or leads of electric components mounted on the work from being bent or damaged.

However, the protective sheet is unnecessary during an exposure process. Accordingly, a typical transfer device removes a protective sheet from a work while it is being fed from a supply reel, and feeds only the tape to a process stage. Subsequently, another protective sheet is put on the processed work, while the work is being wound around a take-up reel.

FIG. 13 schematically shows a transfer device as disclosed by JP3663421, JP-A2004-193259 or JP-A2005-93958.

Referring to this drawing, a transfer device 1100 includes:
1) a supply reel 1101 around which both a tape T1 and a protective sheet S1 are wound;
2) a take-up reel 1102 that winds the tape T1 fed from the supply reel 1101;
3) another take-up reel 1103 that winds the protective sheet S1 fed from the supply reel 1101;
4) another supply reel 1104 around which a protective sheet S2 that is to be put on the tape T1 is wound; and
5) a process section 105 positioned between the supply reel 1101 and the take-up reel 1102. Only the tape T1 is subjected to a process at the process section 105, because the protective sheet S1 is fed separately and away from the tape T.

The transfer device 1100 is configured to adjust the tension of the protective sheet S1, while the protective sheet Si is being wound around the take-up reel 1103.

Specifically, (1) JP3663421 discloses the nip rollers between the supply reel 1101 and the take-up reel 1103.

(2) JP-A2004-193259 discloses a motor coupled to a driving shaft of the take-up reel 1103 through a clutch.

(3) JP-A2005-93958 discloses a spring for applying an elastic force to the protective sheet S2.

FIG. 14 schematically shows another transfer device as disclosed by JP-A2005-5586.

Referring to this drawing, a transfer device 1200 includes:
a supply reel 1201 around which both a tape T1 and a protective sheet S1 are wound;
a take-up reel 1202 that winds the tape T1 and the protective sheet 51 which are both fed from the supply reel 1201;
a transfer system 1203 that feeds the tape T1 from the supply reel 1201 to the take-up reel 1202;
a transfer system 1204 that feeds the protective sheet S1 from the supply reel 1201 to the take-up reel 1202; and
an inspection device 1205 provided in the transfer system 1203.

In this device 1200, both the tape T1 and the protective sheet S1 are fed from the supply reel 1201, and they are forwarded by the transfer systems 1203 and 1204, respectively. In addition, only the tape T1 is subjected to a test by the inspection device 1205.

However, the above-described transfer devices have the following disadvantages.

The transfer device of JP2836787 discloses the air dancer for preventing a work fed from the supply reel from being loosened due to its weight and from undergoing excess tensions.

However, in a transfer device of this type, a work is kept in a horizontal position on an exposure stage, and the work is brought into contact with the mask. Therefore, as becoming wider, the work is more likely to be loosened. Thus, it is difficult for the transfer device to prevent the looseness of a wide work.

Furthermore, the mask and the work are brought into contact with each other. or are placed close to one another. Hence, contaminations may be adhered to the surfaces of the mask and the work because of static electricity. This may cause the deterioration of the patterning resolution.

The transfer device of JP-A2005-326550, JP-A2005-91903 or JP2798158 discloses the pairs of rollers for pinching a work before and after the exposure stage. With this device, the mask, optical system and work are aligned easily, but the work is prone to undergo excess loads from the rollers.

Moreover, the transfer device as shown in FIG. 13 needs the take-up reel 1103 dedicated for winding the protective sheet S1 fed from the supply reel 1101. In addition, the nip roller, clutch and spring for adjusting the tension of the protective sheet S1 on the take-up reel 1103 are also required. Thus, this transfer device must be equipped with many accessory members. Moreover, the supply reel 1104 is installed near the take-up reel 1102. This installing process can be troublesome.

In the transfer device as shown in FIG. 14, the protective sheet S1 fed from the supply reel 1201 is directly wound by the take-up reel 1202. Therefore, any accessory members are unnecessary. However, the supply reel 1201, inspection device 1205 and take-up reel 1202 are arranged laterally. This arrangement leads to the enlargement of the device. Accordingly, a large area must be ensured for installing such an enlarged device.

Furthermore, in the transfer device 1200 as shown in FIG. 14, the transfer system 1204 is positioned above the inspection device 1205. In this structure, contaminants on the protective sheet S1 may fall down to the working area of the inspection device 1205.

Moreover, the transfer device 1200 discloses the transfer systems 1203 and 1204. The system 1203 loosens the tape T1 between the supply reel 1201 and the inspection device 1205 and between the inspection device 1205 and the take-up reel 2002 in order to adjust the tension of the tape T1. Meanwhile, the transfer system 1204 adjusts the tension of protective sheet S1 near the take-up reel 1202. Since both tension-adjusting methods are quite different, it is difficult for the device 1200 to run the tape T1 and the protective sheet S1 in sync with each other. As a result, the take-up reel 1202 may fail to wind them in balance.

Taking the above disadvantages into account, the present invention has been conceived. An object of the present invention is to provide a transfer device that can feed a work in a stable condition without applying it any excess loads. An additional object of the present invention is to present a transfer device capable of winding a work and a protective sheet in balance.

SUMMARY OF THE INVENTION

According to a first aspect of the present invention, there is provided, a transfer device for feeding a tape-shaped work to a process stage standing in an upright position, the transfer device being placed on one side of the process stage, the transfer device including:
a1) a supply reel around which the work and a protective sheet are wound, the supply reel for feeding the work and the protective sheet therefrom;
a2) a take-up reel for winding the work and the protective sheet that have been fed from the supply reel, the take-up reel being located below the supply reel; and
a3) a work feeding mechanism for forwarding the work from the supply reel to the take-up reel through the process stage.

With this transfer device, the work can be moved on the process stage easily, because the process stage is provided in an upright position.

According to a second aspect of the present invention, there is provided, a transfer device for feeding a tape-shaped work that is to be subjected to a process on a process stage standing in an upright position, the transfer device including:
b1) a supply reel rotating section for feeding the work by rotating a supply reel around which the work is wound;
b2) first and second supply guide rollers for guiding the work fed from the supply reel rotating section;
b3) a supply slack absorber for adjusting a tension of the work between the first and second supply guide rollers, the supply slack absorber being located therebetween;
b4) first and second transfer rollers for feeding, along the process stage, the work fed from the second supply guide roller, the first and second transfer rollers being arranged above and below the process stage, respectively;
b5) first and second take-up guide rollers for guiding the work fed from the second transfer roller;
b6) a take-up slack absorber for adjusting a tension of the work between the first and second take-up guide rollers, the take-up slack absorber being located therebetween; and
b7) a take-up reel rotating section for winding the work fed from the second take-up guide roller by rotating a take-up reel.

Further, the supply reel rotating section is located higher than the first supply guide roller. The second supply guide roller is located as high as or lower than the first supply guide roller, and higher than the first transfer roller. The take-up reel rotating section is located higher than the second take-up guide roller. The second take-up guide roller is located as high as or higher than the first take-up guide roller, and lower than the take-up reel rotating section.

This transfer device feeds the tape-shaped work from the supply reel to the supply slack absorber by using the take-up reel rotating section and the first supply guide roller and, then feeds it to the process stage by using the second supply guide roller, the first and second transfer rollers, and the first take-up guide roller. Furthermore, the transfer device winds the work from the take-up slack absorber by using the second take-up guide roller and the take-up reel rotating section. The first and second transfer rollers feed the work for each block at predetermined intervals, while sucking the work onto the roller surface through the absorbing holes.

The device feeds the work obliquely downward from the supply reel rotating section to the first transfer roller. Moreover, the device feeds the work obliquely upward from the second transfer roller to the take-up reel rotating section. Hence, the work is prevented from being loosened due to its weight.

According to a third aspect of the present invention, there is provided, the transfer device according to the second aspect in which each of the second supply guide roller and the first take-up guide roller includes a work position adjuster for displacing the work on its rotational axis, based on a misaligned amount of the work on the process stage.

With this transfer device, the work can be positioned on the process stage with precision According to a fourth aspect of the present invention, there is provided, the transfer device according to the second aspect in which each of the first transfer roller and the second transfer roller has a roller main body made of synthetic resin.

With this transfer device, slight vibrations of the work can be absorbed by the roller main bodies of the first and second transfer rollers.

According to a fifth aspect of the present invention, there is provided, the transfer device according to the second aspect, further including a removable work connection mechanism for connecting a tail end of the work in course of a process on the process stage and a front end of another virgin work, the work connection mechanism being provided between the supply reel rotating section and the first supply guide roller.

With this transfer device, the tail end of the work that is being processed and the front end of the other work can be connected.

According to a sixth aspect of the present invention, there is provided, the transfer device according to the second aspect in which the process stage includes an exposure stage on which patterns formed on a mask are transferred to a surface of the work fed for each block by the transfer device.

With this transfer device, the patterns on the mask can be transferred to the surface of the work stably, while the work is fed to the exposure stage for each block.

According to a seventh aspect of the present invention, there is provided, the transfer device according to a sixth aspect in which when the work is misaligned with a predetermined position on the process stage by a threshold or less, the misaligned amount is adjusted to substantially zero by displacing the mask, and when the work is misaligned with the predetermined position on the process stage by more than the threshold, each of the second supply guide roller and the first take-up guide roller is displaced on its rotational axis.

With this transfer device, a period during which the mask is aligned with the work is shortened, because the misaligned amount between the mask and the work is decreased.

According to an eighth aspect of the present invention, there is provided, the transfer device according to the sixth aspect in which when the work is misaligned with a predetermined position on the process stage by a threshold or less, the misaligned amount is adjusted to substantially zero by displacing the mask, and when the work is misaligned with the predetermined position on the process stage by more than the threshold, an amount at which the first and second transfer rollers feed the work is adjusted.

This transfer device adjusts the amount at which the first and second transfer rollers feed the work to an area to be processed on the exposure stage once. By this, the misaligned amount can be decreased. Hence, a period during which the mask is aligned with the work is shortened.

According to a ninth aspect of the present invention, there is provided, the transfer device according to the second aspect in which each of the first and second transfer rollers includes a plurality of absorbing holes and an absorbing mechanism coupled to the absorbing holes, and the work is sucked onto the absorbing holes by the absorbing mechanism.

With this transfer device, the work can be fed precisely, because the work does not slip over the roller surfaces of the first and second transfer rollers.

According to a tenth aspect of the present invention, there is provided, the transfer device according to the second aspect in which each of the first and second supply guide rollers and the first and second take-up guide rollers includes a plurality of absorbing holes and an absorbing mechanism coupled to the absorbing holes, and the work is sucked onto the absorbing holes by the absorbing mechanism.

With this transfer device, the work can be fed from the supply reel to the tale-up reel smoothly, because the work does not slip over the roller surfaces of the first and second supply guide rollers and the first and second take-up guide rollers.

According to an eleventh aspect of the present invention, there is provided, a transfer device for feeding a tape-shaped work to a process stage standing in an upright position, the transfer device being located on one side of the process stage, said transfer device including:

c1) a supply reel around which the work and the protective sheet are wound, the supply reel for feeding the work and the protective sheet therefrom;

c2) a take-up reel for winding the work and the protective sheet that have been fed from the supply reel, the take-up reel being located below the supply reel;

c3) a work feeding mechanism for feeding the work from the supply reel to the take-up reel through the process stage; and c4) a protective sheet feeding mechanism for feeding the protective sheet from the supply reel to the take-up reel, the protective sheet being forwarded on the side opposite to the process stage with respect to the supply reel.

In this transfer device, the work is fed from the supply reel to the take-up reel by the work feeding mechanism. At the same time, the protective sheet is fed from the supply reel to the protective sheet by the protective sheet feeding mechanism. In other words, the work and the protective sheet are fed from the supply reel to the take-up reel separately. Therefore, a reel dedicated for winding the protective sheet is unnecessary.

Since the take-up reel is located below the supply reel, the lateral length of the transfer device is shortened, thereby making the device compact.

Moreover, the protective sheet is fed from the supply reel to the take-up reel while being away from the process stage. Hence, even if contaminants are adhered to the surface of the protective sheet, the contaminants do not fly to the process stage.

According to a twelfth aspect of the present invention, there is provided, the transfer device according to the eleventh aspect in which the protective sheet feeding mechanism is provided with a protective sheet tension adjuster including:

d1) a first roller for guiding the protective sheet from the supply reel;

d2) a second roller for guiding the protective sheet to the take-up roller; and d3) a first air dancer for adjusting a tension of the protective sheet between the first roller and the second roller.

With this transfer device, the protective sheet can be fed, while the protective sheet tension adjuster maintains the tension of the protective sheet a proper value.

According to a thirteenth aspect of the present invention, there is provided, the transfer device according to the eleventh aspect in which a route on which the work is fed from the supply reel to the take-up reel through the process stage makes a closed loop, and a route on which the protective sheet is fed from the supply reel to the take-up reel makes a closed loop.

With this transfer device, a reel dedicated for winding the protective sheet can be omitted.

According to a fourteenth aspect of the present invention, there is provided, the transfer device according to the eleventh aspect further including a first sensor for sensing a position of side edges of the work fed from the process stage to the take-up reel, and a second sensor for sensing a position of side edges of the protective sheet fed from the supply reel to the take-up reel. In addition, the side edges of the work are aligned with those of the protective sheet, based on sensing results of the first and second sensors, and the work and the protective sheet are then wound by the take-up reel.

With this transfer device, the work and the protective sheet can be wound around the take-up reel, while they are aligned.

According to a fifteenth aspect of the present invention, there is provided, the transfer device according to the eleventh aspect in which the work feeding mechanism includes a first tension adjuster which adjusts a tension of the work between the supply reel and the process stage and which is placed therebetween, and a second tension adjuster which adjusts a tension of the work between the process section and the take-up reel and which is placed therebetween. In addition, the first tension adjuster includes a third roller for guiding the work fed from the supply reel, a fourth roller for guiding the work to the process stage, and a second air dancer for adjusting the tension of the work between the third roller and the fourth roller. Furthermore, the second tension adjuster includes a fifth roller for guiding the work from the process stage, a sixth roller for guiding the work to the take-up reel, and a third, air dancer for adjusting the tension of the work between the fifth roller and the sixth roller.

With this transfer device, the tape can be fed while its tension is kept properly by the first and second tension adjusters.

The transfer device of the present invention attains the ability to feed the work from the supply reel to the take-up reel through the process stage without pinching or loosening the work. Thus, it is possible for the transfer device to feed the work without applying excess loads to the work, and to position it to a predetermined location on the process stage with precision.

Thus, the transfer device of the present invention produces the following effects.
1) The work and the protective sheet are fed from the supply reel to the take-up reel, while they are aligned. Therefore, any accessory members such as an additional take-up reel are unnecessary.
2) Since the take-up reel is located below the supply reel, the transfer device can be made compact.
3) The protective sheet feeding mechanism feeds the protective sheet, while it is away from the process stage. Accordingly, even if contaminants are adhered to the surface of the protective sheet, the contaminants are less likely to fly to the process stage.
4) The protective sheet and the work are wound around the take-up reel, while they are aligned.
5) Because the tensions of the work and the protective sheet are kept properly, they are wound in balance.

Other aspects, features and advantages of the present invention will become apparent upon reading the following specification and claims when taken in conjunction with the accompanying drawings.

BRIEF DESCRIPTION OF THE DRAWINGS

For more complete understanding of the present invention and the advantages hereof, reference is now made to the following description taken in conjunction with the accompanying drawings wherein.

DETAILED DESCRIPTION OF THE
EXEMPLARY EMBODIMENTS OF THE
INVENTION

[First Embodiment]

A description will be given below, of a transfer device according to a first embodiment of the present invention, with reference to FIGS. 1 to 7.

Before describing a transfer device A. according to a first embodiment of the present invention, an explanation will be given below, of a tape-shaped tape T (or work) to be fed by the transfer device A.

(Structure of Tape (Work))

Figure 1:
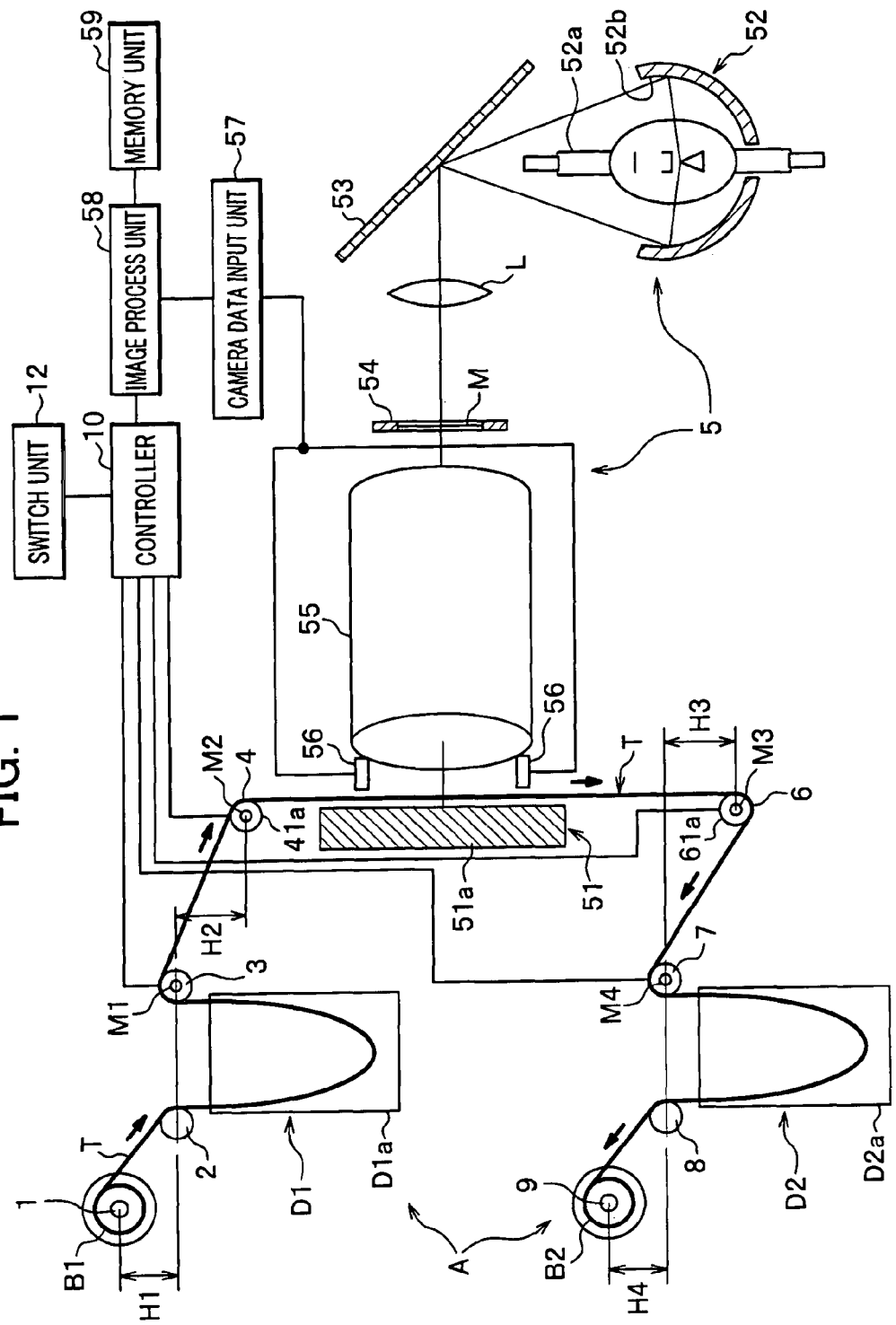
FIG. 1 is a block diagram illustrating a transfer device according to a first embodiment of the present invention and a corresponding exposure device.
Figure 2:
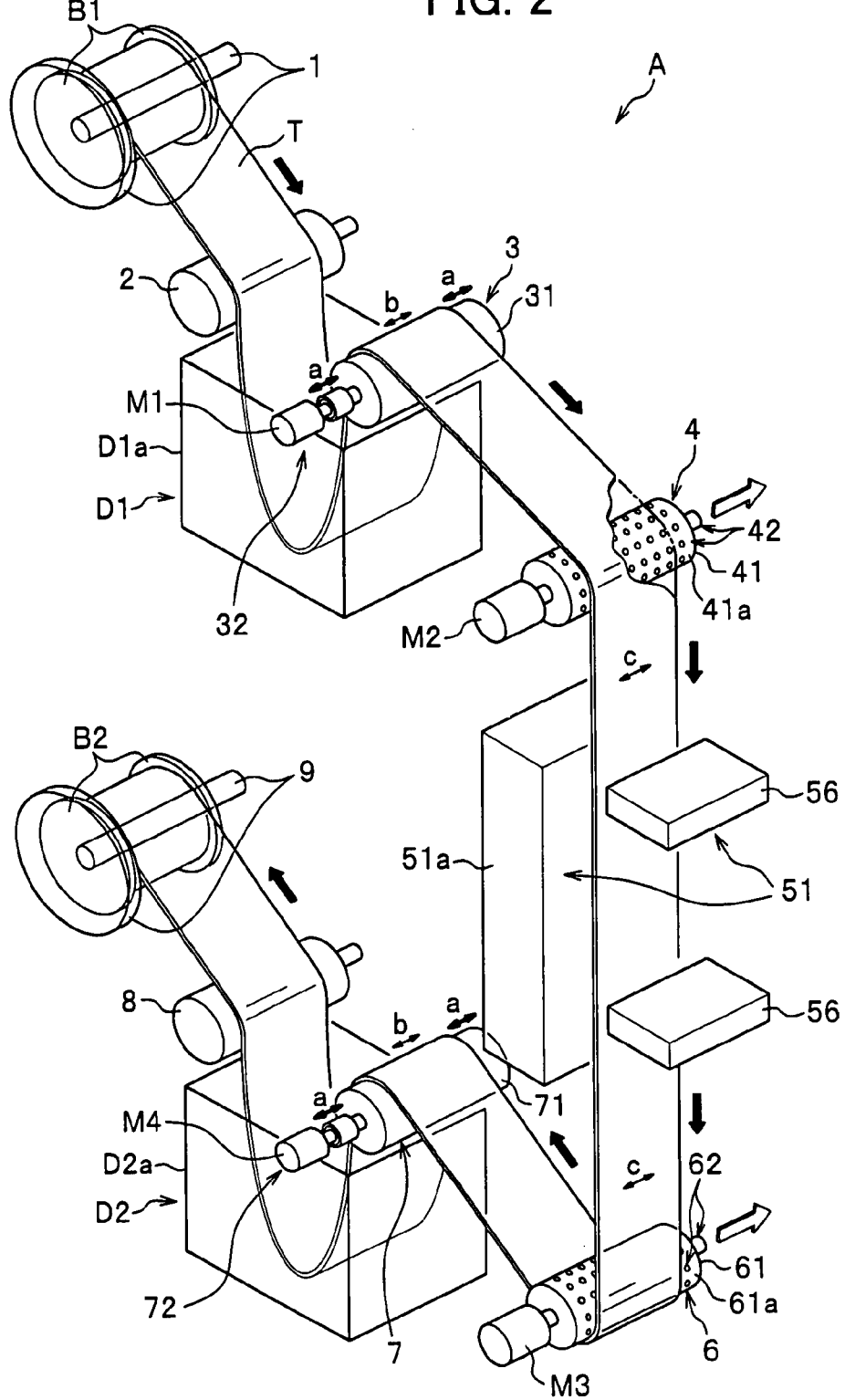
FIG. 2 is a perspective view depicting the transfer device.

Referring to FIGS. 1 and 2, a tape T is used for an electronic circuit board, and it is made of a flexible material or a hoop material. Its size is, for example, 160 mm wide and 200 m long. This tape T is kept wound around a supply reel rotating section 1. In addition, the tape T may have perforations (not shown) on both sides.

The transfer device A is configured to feed the tape T. In this embodiment, the transfer device A is assumed to forward the film-shaped tape T made of a flexible material.

(Structure of Transfer Device)

The transfer device A feeds the tape T to an upright exposure stage 51a (process stage 51) of an exposure device 5. The tape T is fed at regular intervals, and is subjected to a process for each block by the exposure device 5.

This transfer device A is constituted by:
a) the supply reel rotating section 1 for rotating a supply reel B1 around which the tape T is wound;
b) first and second supply guide rollers 2 and 3 for guiding the tape T;
c) first and second transfer rollers 4 and 6 for feeding the tape T, which are arranged above and below the process stage 51, respectively;
d) first and second take-up guide rollers 7 and 8;
e) a take-up reel rotating section 9 for rotating a take-up reel B2 around which the tape T is to be wound; and
f) supply and take-up slack absorbers D1 and D2 for adjusting a tension of the tape T.

[Structure of Supply Reel Rotating Section]

The supply reel rotating section 1 is adapted to feed the tape T from the supply reel B1. It is driven by a motor (not shown). The supply reel B1 has a drum of, for example, 750 mm in diameter and is provided with flanges on both sides. The tape T on the supply reel B1 is pulled toward the first supply guide roller 2 by the first transfer roller 4, and the supply reel B1 then rotates in conjunction with the first transfer roller 4. Consequently, the tape T on the supply reel B1 is fed toward the first supply guide roller 2.

[Structure of First Supply Guide Roller]

As shown in FIGS. 1 and 2, the first supply guide roller 2 serves as an auxiliary roller for feeding the tape T from the supply reel B1 to the supply slack absorber D1. The first supply guide roller 2 rotates about its rotational axis. The first supply guide roller 2 is positioned lower than the supply reel rotating section 1. Due to this arrangement, the tape T having passed the roller 2 is slackened by its weight.

Figure 3:
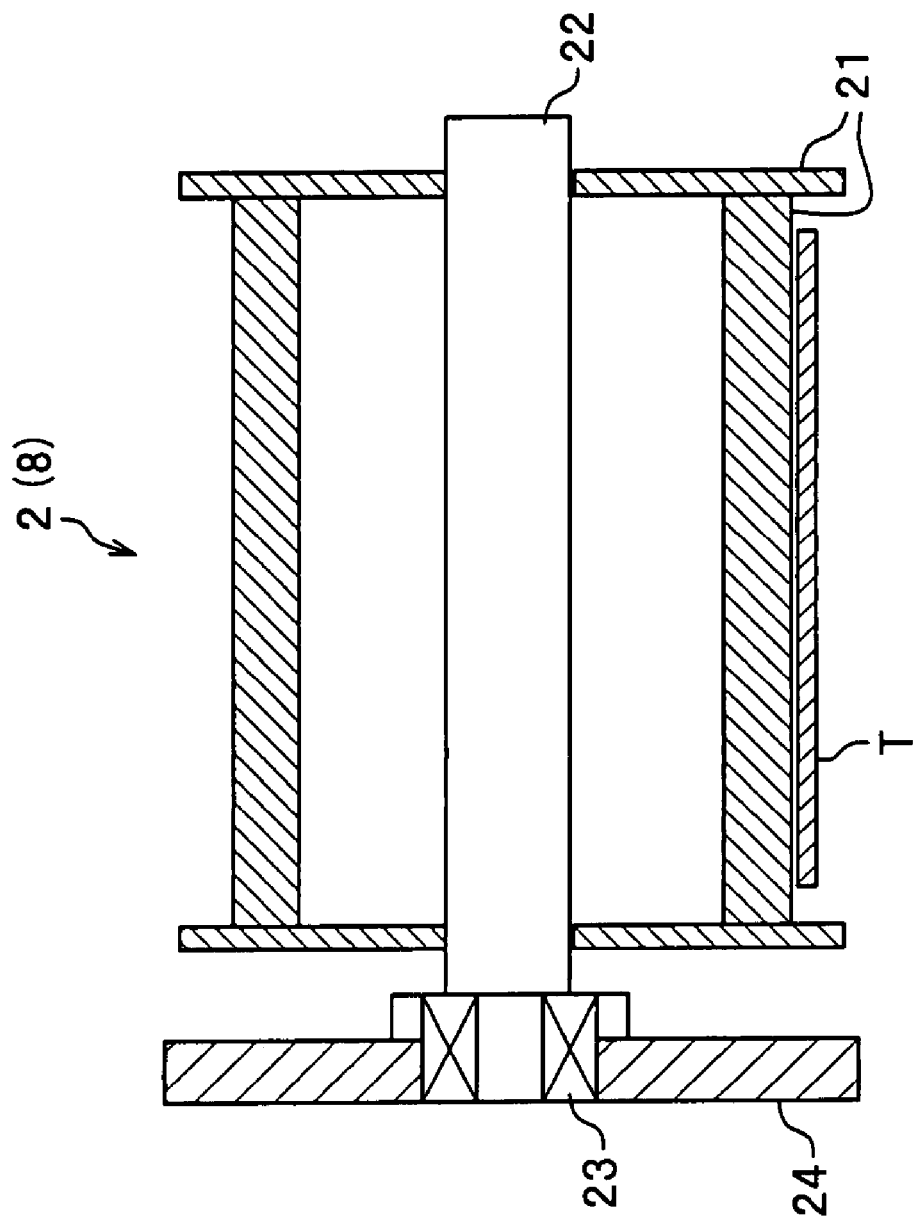
FIG. 3 is a cross-section view depicting a first supply guide roller of the transfer device.

Referring to FIG. 3, the first supply guide roller 2 includes:
a roller main body 21 around which the tape T is to be wound;
a shaft 22 for rotatably supporting the roller main body 21;
a bearing 23 rotatably coupled to the shaft 22; and
a casing 24 for holding the bearing 23.

Note that the second take-up guide roller 8 (see FIG. 2) may have the same structure as that of this first supply guide roller 2.

[Structure of Supply Slack Absorber]

Referring back to FIGS. 1 and 2, the supply slack absorber D1 is adapted to adjust a tension of the tape T. The supply slack absorber D1 is positioned between the first and second supply guide rollers 2 and 3, and contains a portion of the tape T1 which ranges therebetween. Specifically, within the supply slack absorber D1, the tape 1 is be slackened in a U shape due to its weight. Accordingly, the portions of the tape T which range between the section 1 and roller 2 and between the rollers 3 and 4 do not undergo an excess tension or are not loosened greatly.

The supply slack absorber D1 has a box D1a, and the tape T runs inside the box D1a via the upper opening of the box D1a while being slackened in a U shape due to its weight. Specifically, when reaching the upper opening, the tape T is fed downstream, that is, to the interior of the box D1a. As a result, the portion of the tape T which resides inside the box D1a is slackened due to its weight. Following this, the slackened portion of the tape T is pulled by the first transfer roller 4 and is thus fed upward and downstream from the box D1. This box D1a may have a box shape with upper and lower openings and a bottom.

[Structure of Second Supply Guide Roller]

Figure 4:
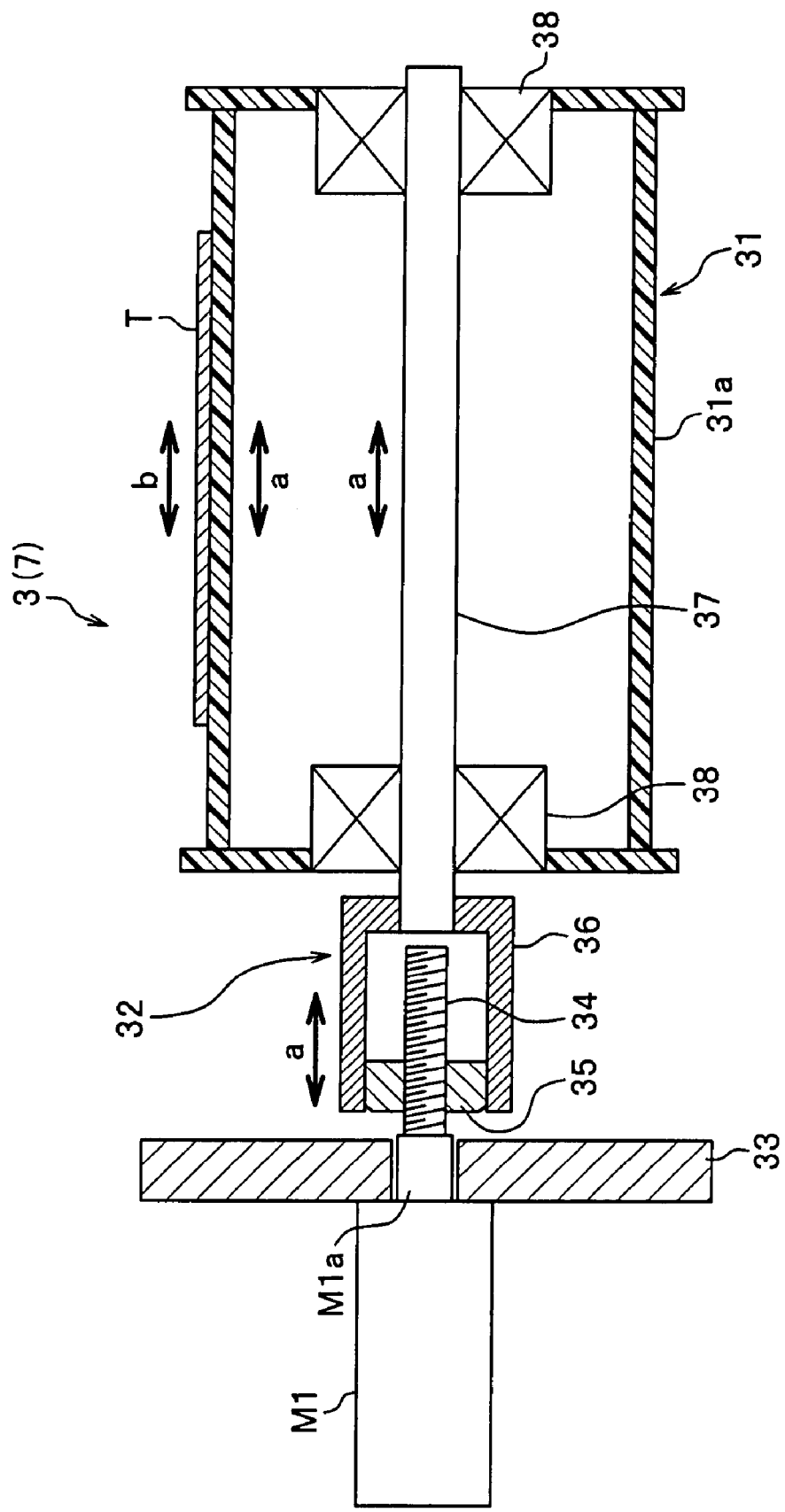
FIG. 4 is a cross-section view depicting a second supply guide roller of the transfer device.

Referring to FIG. 4, the second supply guide roller 3 is adapted to feed the tape T from the supply slack absorber D1 to the first transfer roller 4, and has a work position adjuster 32 for displacing the tape T in the directions of an arrow "b" (on the rotational axis).

The second supply guide roller 3 is constituted by:
a motor M1;
a casing 33 for holding the motor M1;
a ball screw 34 fixed to a motor shaft M1a;
a rotatable roller main body 31 for feeding the tape T;
a nut 35 for being displaced on the ball screw 34 in accordance with the rotation of the ball screw 34;
a spline shaft 36 for being displaced in conjunction with the nut 35;
a shaft 37 for being displaced in conjunction with the spline shaft 36, and
bearings 38 arranged between the shaft 37 and the roller main body 31.

The work position adjuster 32 is adapted to adjust the position of the tape T which ranges over the process stage 51 by displacing the roller main body 31 on the rotational axis. This work position adjuster 32 may be composed of the motor M1, ball screw 34, nut 35, spline shaft 36, shaft 37 and roller main body 31.

The motor M1 of FIG. 4 displaces the roller main body 31 in the directions of an arrow "a," while rotating the roller main body 31. In addition, the motor M1 rotates clockwise or counterclockwise in response to signals from a controller 10, thereby displacing the tape T in the directions of the arrow "b." The second supply guide roller 3 is held at a predetermined position in the casing 33.

The ball screw 34 is coupled to the motor shaft M1a of the motor M1 and rotates in conjunction with the motor shaft M1a. Between the ball screw 34 and the motor shaft M1a, a reduction gear mechanism may be provided. The nut 35 mates with the ball screw 34 and is contained in the spline shaft 36. The rotation of the ball screw 34 allows the nut 35 to displace in the directions of the arrow "a."

The spline shaft 36 rotates in conjunction with the nut 35, while displacing in the directions of the arrow "a." The shaft 37 is secured to the bottom of the spline shaft 36, and displaces in conjunction with the spline shaft 36 while rotating. Both ends of the shaft 37 are received by the bearings 38.

The bearings 38 are rotatably attached to the shaft 37, and displace in conjunction with the shaft 37 in the directions of the arrow "a." The roller main body 31 serves as a roller on which the tape T is to be slung, and may have a bobbin shape with flanges. It displaces in the directions of the arrow "a" in conjunction with the bearings 38. Moreover, the roller main body 31 has a roller surface 31a made of synthetic resin in order to absorb slight vibrations. In this case, it is preferable that the roller surface 31a is made of soft resin that possesses buffering property. Alternatively, such soft resin may be coated on the roller surface 31a.

In the above second supply guide roller 3, the rotation of the motor M1 allows the ball screw 34, spline shaft 36, shaft 37 and bearings 38 to rotate and displace. As a result, the roller main body 31 displaces on the rotational axis, whereby the position of the tape T on the rotational axis is changed. This enables the tape T to be set on the process stage 51 appropriately.

Alternatively, the second supply guide roller 3 may have a structure that the motor M1 rotates the shaft 37 only. In this case, the second supply guide roller 3 needs to be displaced by a different motor or a linear slide mechanism, etc.

Note that the first take-up guide roller 7 (see FIG. 2) may have the same structure as that of the above second supply guide roller 3.

[Structure of First Transfer Roller]

Figure 5:
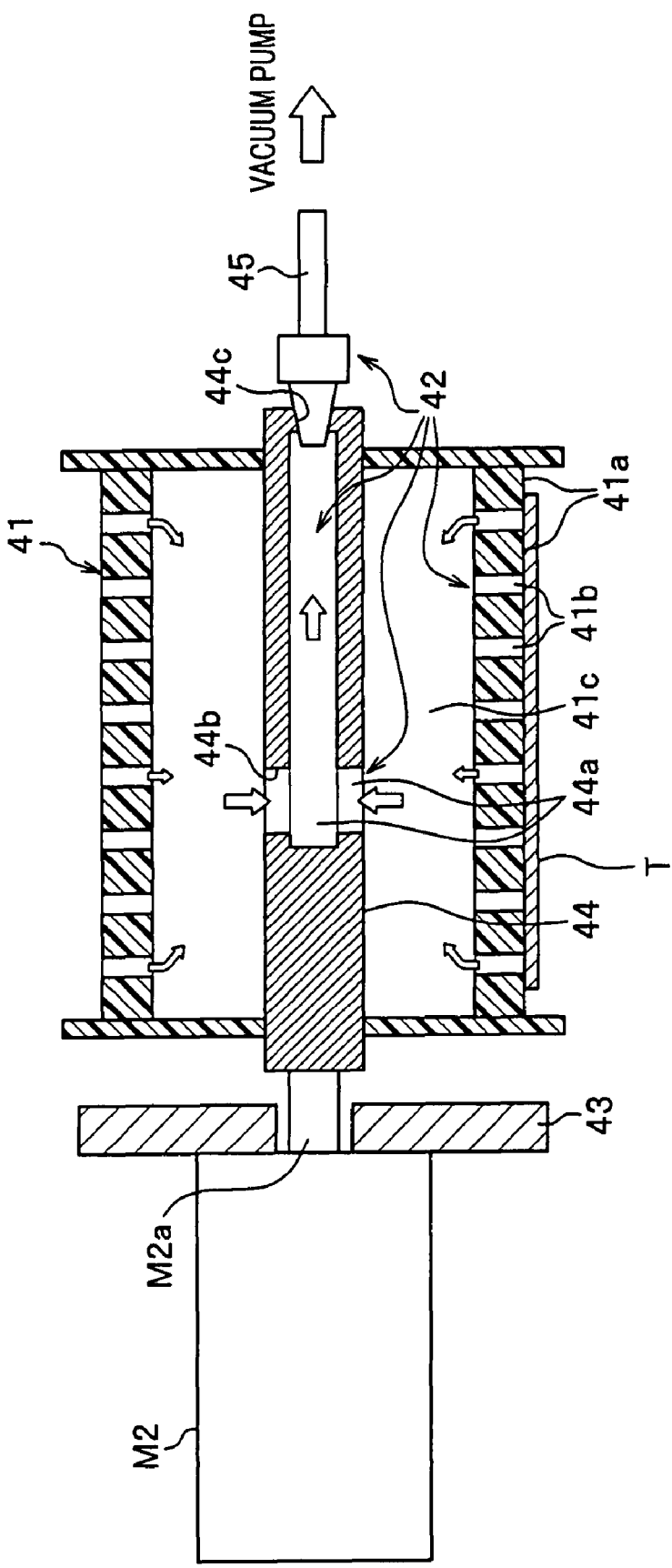
FIG. 5 is a cross-section view depicting a first transfer roller of the transfer device.

Referring to FIG. 5, the first transfer roller 4 is adapted to feed the tape T from the second supply guide roller 3 to the exposure stage 51a (process stage 51). It is rotated at regular intervals by the motor M2, thereby feeding the tape T for each block. This first transfer roller 4 includes multiple absorbing holes 41b and an absorbing mechanism 42 which both are configured to draw the tape T onto the roller surface 41a of the roller main body 41. With these members, the tape T can be fed without slipping over the first transfer roller 4.

Furthermore, the first transfer roller 4 includes:
the motor M2 for rotating the roller main body 41;
a casing 43 for supporting the motor M2 and a motor shaft M2a;
a rotational shaft 44 that is attached to a motor shaft M2a and that has an absorbing path 44a in the absorbing mechanism 42; and
an exhaustion section 45 to be coupled to a vacuum pump (not shown) via the rotational shaft 44.

Referring back to FIG. 1, the first transfer roller 4 is placed downstream of the supply slack absorber D1. In addition, it is positioned immediately above the exposure stage 51a, so that the tape T is set parallel to the exposure stage 51a.

The roller main body 41 as shown in FIG. 5 is a hollow rotatable body which is fixed to the rotational shaft 44 and which has a bobbin shape with flanges. The roller surface 41a of the roller main body 41 may be made of soft synthetic resin having buffering property for the purpose of absorbing slight vibrations of the tape T. The roller surface 41a has many absorbing holes 41b thereon. Since air flows through those absorbing holes 41b, the tape T cools down the roller surface 41a. . The roller surface 41a may be made of stainless steel or made by twisting stainless wires.

The absorbing mechanism 42 is adapted to bring the tape T into contact with the roller surface 41a by drawing it thereto using the vacuum pump (not shown). The absorbing mechanism 42 includes the absorbing holes 41b for absorbing air, a roller inner area 41c through which the air flows, the absorbing path 44a communicating with the roller inner area 41c, the exhaustion section 45 and the vacuum pump (not shown).

As described above, the first transfer roller 4 includes the roller main body 41 and the absorbing mechanism 42, and it feeds the tape T smoothly while keeping it into contact with the roller surface 41a by means of negative pressure.

The motor M2 as shown in FIG. 5 is adapted to rotate the roller main body 41 in order to feed the tape T from the roller main body 41. The motor M2 is electrically connected to the controller 10, and is controlled thereby (see FIG. 1). The casing 43 is adapted to support the motor M2 and the motor shaft M2a at respective predetermined locations, so that the first transfer roller 4 is positioned at a predetermined height (see FIG. 1).

The rotational shaft 44 has a function of transmitting the rotational power of the motor M2 to the roller main body 41 in order to rotate it, and supplying air in the roller main body 41 to the vacuum pump (not shown). One end of the rotational shaft 44 is coupled to the motor shaft M2a, and the other is coupled to the exhaustion section 45 of the absorbing mechanism 42. The rotational shaft 44 has, at its center, suction holes 44b for drawing air into the roller main body 41. At the end of the absorbing path 44a, a discharge hole 44c for exhausting the air to the exhaustion section 45 is formed. The rotational shaft 44 has a hollow area ranging between the suction holes 44b and the discharge hole 44c.

The vacuum pump (not shown) serves as a negative pressure generator. It is connected to the exhaustion section 45 via a pipe or a leak valve. Therefore, the vacuum pump sucks air onto the roller surface 41a via the absorbing path 44a and the absorbing holes 41b, or draws the tape T onto the roller surface 41a by means of negative pressure.

Note that the second transfer roller 6 may have the same structure as that of this first transfer roller 4.

[Structure of Process Stage]

Now, the process stage 51 as shown in FIG. 2 will be described blow. The process stage 51 is located immediately below the first transfer roller 4, and gives the tape T fed from the first transfer roller 4 to a predetermined process. The process stage 51 is located parallel to the portion of the tape T which ranges between the first and second transfer rollers 4 and 6. In this embodiment, the process stage 51 is represented by the exposure stage 51a on which the exposure device 5 conducts an exposure process. The exposure stage 51a has the absorbing holes for holding the tape T.

[Structure of Second Transfer Roller]

The second transfer roller 6 is located immediately below the exposure stage 51a and downstream thereof. It feeds the tape T having been subjected to the exposure process on the exposure stage 51a. The second transfer roller 6 may have the same structure as the first transfer roller 4 as shown in FIG. 5. Specifically, as shown in FIG. 2, the second transfer roller 6 may include the absorbing mechanism 62 for drawing the tape Tonto the roller surface 61a of the roller main body 61, and the motor M3 for rotating the roller main body 61.

[Structure of First Take-up Guide Roller]

The first take-up guide roller 7 is adapted to forward the tape T fed from the second transfer roller 6 to the take-up slack absorber D2. The first take-up guide roller 7 may have the same structure as the second supply guide roller 3 as shown in FIG. 4. Specifically, as shown in FIG. 2, the first take-up guide roller 7 may include a work position adjuster 72 for displacing the tape Ton the rotational shaft, and a motor M4 that is a power source for the work position adjuster 72.

[Structure of Take-up Slack Absorber]

The take-up slack absorber D2 is placed to contain the portion of the tape T which ranges between the first and second take-up guide rollers 7 and 8. The take-up slack absorber D2 adjusts the tensions of the tape T between the rollers 6 and 7 and between the roller 8 and the take-up reel B2. The first take-up guide roller 7 is located upstream of the take-up slack absorber D2, while the second take-up guide roller 8 is located downstream thereof. The take-up slack absorber D2 may have the same structure as that of the supply slack absorber D1. Specifically, the take-up slack absorber D2 may have a box D2a. The tape T that is fed by the first take-up guide roller 7 enters the take-up slack absorber D2. Following this, it slackens in a U shape within the box D2a due to its weight, and it then goes out of the take-up slack absorber D2 by being fed to the second take-up guide roller 8.

[Structure of Second Take-up Guide Roller]

As shown in FIG. 2, the second take-up guide roller 8 serves as an auxiliary roller for guiding the tape T to the take-up reel B2. It may have the same structure as the first supply guide roller 2 as shown in FIG. 3. This second take-up guide roller 8 is placed at a predetermined position by a casing (not shown), and is rotatable about its rotational axis. In addition, the second take-up guide roller 8 is placed such that the tape T having gone out of the take-up slack absorber D2 is fed obliquely upward.

[Structure of Take-up Reel Rotating Section]

Referring to FIG. 2, the take-up reel rotating section 9 supports the take-up reel B2 for winding the tape T having been subjected to the exposure process on the process stage 51. It is rotated about its rotational axis by a motor (not shown).

(Structure of Exposure Device)

Referring back to FIG. 1, the exposure device 5 is configured to transfer patterns formed on the mask M to the surface of the tape T for each block. This exposure device 5 mainly includes an optical source 52, a reflector 53, a fly eye lens L, a support unit 54 for supporting the mask M, a projection optics (such as the Dyson optics or reduced projection optics) 55, image pick-up units 56, and the exposure stage 51a. Furthermore, the exposure device 5 includes a camera data input unit 57, an image process unit 58, a memory unit 59, the controller 10 and a switch unit 12.

The optical source 52 emits light of a predetermined wavelength, and includes a lamp 52a and an elliptic mirror 52b for covering the back of the lamp 52a. The reflector 53 is composed of a plane mirror for reflecting the light from the optical source 52 toward the mask M. The fly eye lens L adjusts the illumination distribution of the light from the reflector 53.

The mask M as shown in FIG. 1 is located opposite the projection optics 55 while being supported by the support unit 54. This support unit 54 can travel on a plane perpendicular to the optical axis of the projection optics 55 by a drive mechanism (not shown).

The optical axis of the projection optics 55 is positioned parallel to a floor surface on which the exposure device 5 is installed. The exposure stage 51*a* faces the mask M across the projection optics 55. This projection optics 55 is made up of multiple lenses and mirrors.

The image pick-up units 56 as shown in FIG. 1 are composed of CCD cameras, and they can be moved laterally and vertically by a driving system. Each of the CCD cameras captures an alignment mark on the mask M and an alignment mark on each block of the tape T that is set on the exposure stage 51*a*. The exposure stage 51*a* is provided with an exhaustion system for drawing the tape T through the absorbing holes, and a compressed air system for blowing compressed air.

The camera data input unit 57 receives images of both alignment marks that have been captured by the image pick-up units 56. The image process unit 58 conducts a process for the alignment marks. Specifically, this image process unit 58 converts the images of the alignment marks acquired from the camera data input unit 57 into positional data. Subsequently, the image process unit 58 sends the positional data to the controller 10 and to the memory unit 59. The memory unit 59 stores this positional data (having been captured by the image pick-up units 56 and converted by the image process unit 58).

The controller 10 includes a CPU, and controls the transfer device A and the entire exposure device 5. The controller 10 aligns the alignment mark on the mask M with the alignment mark on each block of the tape T, based on the positional data from the image process unit 58. The controller 10 instructs the drive mechanism (not shown) of the support unit 54 to move the mask M such that both marks are aligned.

If both alignment marks are misaligned by more than a considerable distance (threshold δ), then the mask M needs to be moved over a long distance. Hence, if the misaligned amount exceeds the threshold δ, then the controller 10 controls the second supply guide roller 3, first transfer roller 4, second transfer roller 6 and first take-up guide roller 7 in such a way that the misaligned amount falls within the threshold δ.

On the other hand, the controller 10 monitors and controls the position of the tape T within the supply and take-up slack absorbers D1 and D2, setting of the tape T on the exposure stage 51*a*, the movement of the image pick-up units 56, lighting of the optical source 52, and light shielding. The switch unit 12 is adapted to turn ON or OFF the motors M1, M2, M3 and M4 of the transfer device A, the vacuum pump (not shown) and the exposure device 5.

[Arrangement of Members]

Figure 6:
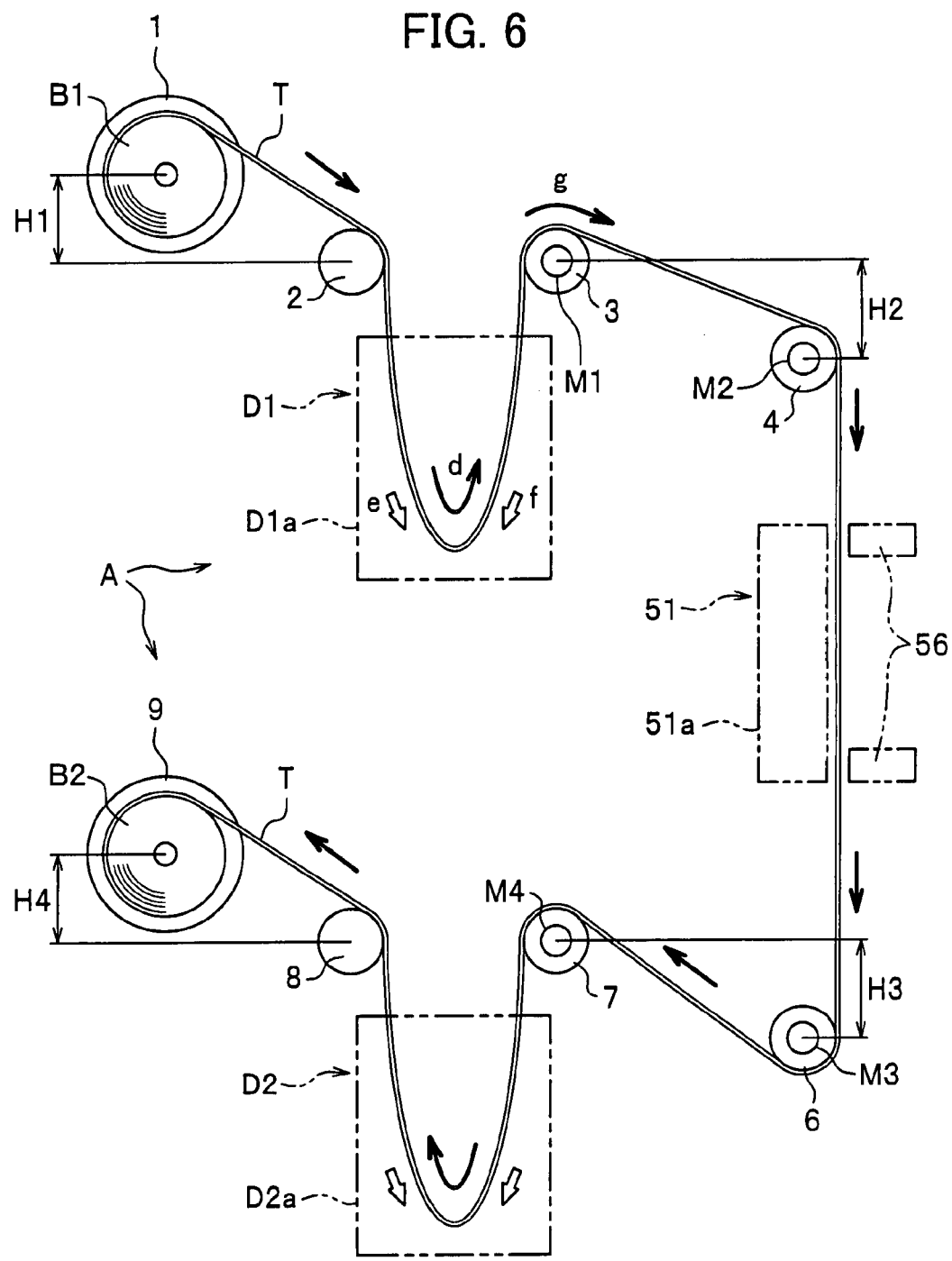
FIG. 6 is a schematic view depicting the transfer device.

Referring to FIG. 6, the supply reel rotating section 1, first supply guide roller 2, second supply guide roller 3, first transfer roller 4, second transfer roller 6, first take-up guide roller 7, second take-up guide roller 8, take-up reel rotating section 9 are arranged on a single plane. Furthermore, a line drawn by connecting the section 1 and rollers 2 to 4 is substantially parallel to a line drawn by connecting the rollers 6 to 8 and the section B2.

The tape T is fed obliquely downward from the supply reel rotating section 1 to the first transfer roller 4 as seen from the side. Substantially, the tape T is fed directly downward from the first to second transfer rollers 4 and 6. Finally, the tape T is fed obliquely upward from the second transfer roller 6 to the take-up reel B2.

The supply reel rotating section 1 is placed higher than the first supply guide roller 2 by a height H1. The first supply guide roller 2 is placed obliquely lower than the supply reel rotating section 1, higher than the opening of the box D1*a* of the supply slack absorber D1, and not lower than the second supply guide roller 3. The supply slack absorber D1 is placed high enough to contain the slack of the tape T between the first and second supply guide rollers 2.

The second supply guide roller 3 is placed higher than the first transfer roller 4 by a height H2 and not higher than the first supply guide roller 2.

The first transfer roller 4, exposure stage 51*a*, second transfer roller 6 are aligned vertically. A feeding route of the tape T is curved at the first transfer roller 4, and the tape T is made to reach the exposure stage 51*a*.

The exposure stage 51*a* is located in the middle of the first and second transfer rollers 4 and 6. The second transfer roller 6 is placed directly below the exposure stage 51*a*. The feeding route of the tape T is curved at the second transfer roller 6.

The first take-up guide roller 7 is located downstream of the second transfer roller 6, higher than the roller 6 by a height H3, and higher than the opening of the take-up slack absorber D2.

The second take-up guide roller 8 is located not lower than the first take-up guide roller 7, lower than the take-up reel rotating section 9 by a height H4, and higher than the box D2*a* of the take-up slack absorber D2. The take-up reel rotating section 9 is located obliquely above the second take-up guide roller 8.

(Operation of Transfer Device)

Figure 7:
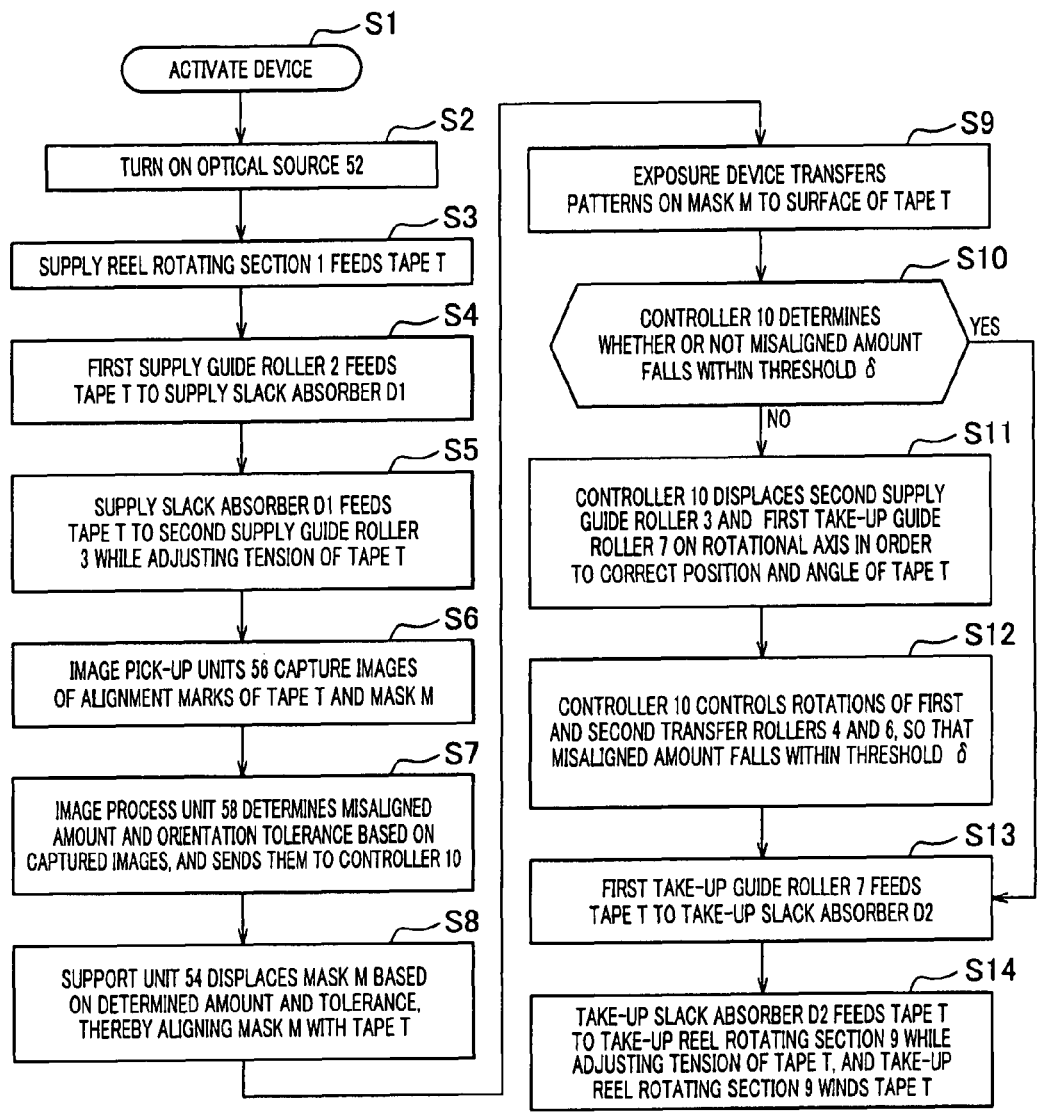
FIG. 7 is a flowchart showing an operation of the transfer device.

FIG. 7 shows a flowchart of an operation of the transfer device according to the first embodiment of the present invention.

An operator sets the virgin tape T on the transfer device A, as shown in FIGS. 1 and 2. Specifically, the supply reel B1 around which the virgin tape T is wound is set on the supply reel rotating section 1. Then, an operator pulls an end of the tape T, and strings the tape T around the rollers 2, 3 and 4. Subsequently, an operator passes the tape T through the exposure stage 51*a*. Following this, an operator strings the tape T around the rollers 6, 7. and 8, and then couples the end of the tape T to the take-up reel B2 in the take-up reel rotating section 9. Finally, an operator loosens the tape T in a U shape within the boxes D1*a* and D2*a* of the supply and take-up slack absorbers D1 and D2, respectively. Now, setting of the tape T is over.

An operator turns ON the switch unit 12. Then, both the exposure device 5 and the transfer device A are activated (step S1). Subsequently, an operator turns ON the lamp 52*a* in the exposure device 5 (step S2). In this situation, the light from the lamp 52*a* is still blinded by a shutter mechanism (not shown). The motors M2 and M3 of the first and second transfer rollers 4 and 6, respectively, are driven, and the vacuum pump (not shown) operates. As a result, the tape T is fed for each block while being sucked onto the roller surfaces 41*a* and 61*a*.

The tape T on the supply reel B1 in the supply reel rotating section 1 is fed by the first and second transfer rollers 4 and 6, as shown in FIG. 2 (step S3).

The tape T is fed obliquely downward from the supply reel rotating section 1, is made to pass the first supply guide roller 2 while its weight is being applied thereto, and to pass through the interior of box D1*a* of the supply slack absorber D1 (step S4).

The tape T is slackened in a U shape within the supply slack absorber D1 due to its weight. The supply slack absorber D1 adjusts the tension of the tape T between the supply reel rotating section 1 and the first transfer roller 4 (step S5).

Specifically, in the box D1*a* of the supply slack absorber D1, the portion of the tape T which is slung from the first supply guide roller 2 is pulled in the direction of an arrow "e" due to its weight, as shown in FIG. 6. Accordingly, portion of the tape T which ranges between the supply reel rotating section 1 and the first supply guide roller 2 is prevented from being loosened.

Furthermore, while being pulled by the first transfer roller 4, the tape T is fed from the interior of the box D1a to the second supply guide roller 3 (in the direction of an arrow "d)." In this situation, the tape T is pulled in the direction of an arrow "f" due to its weight. In other words, the portion of the tape T which ranges between the second supply guide roller 3 and the first transfer roller 4 is pulled in the directions of the arrows "d" and "f." Therefore, the portion of the tape T which ranges therebetween is prevented from being loosened.

In addition, since being fed obliquely downward between the section 1 and the roller 2 and between the rollers 3 and 4, the tape T is less likely to be loosened. The tape T is fed while being sucked onto the roller surface 41a by the absorbing mechanism 42. Hence, the feeding route of the tape T is curved at the first transfer roller 4. In this case, since being made of synthetic resin, the roller surface 41a can absorb the vibration of the tape T.

The tape T fed by the transfer device A is sucked onto the exposure stage 51a, and the portion of the tape T which corresponds to one block is set on the exposure stage 51a. The image pick-up units 56 move between the projection optics 55 and the exposure stage 51a, and capture the images of the alignment marks (not shown) on the tape T and on the mask M (step S6). Based on the images captured by the image pick-up units 56, the image process unit 58 determines a misaligned amount therebetween and an orientation tolerance of the tape T, and sends them to the controller 10 (step S7). The controller 10 allows the support unit 54 to displace the mask M, based on the determined amounts and tolerance, so that the mask M and the tape T are aligned (step S8).

The portion of tape T which has been aligned with the mask M is temporally fixed on the exposure stage 51a while facing the projection optics 55 (see FIG. 1). Then, the shutter mechanism (not shown) is opened. The portion of the tape T is exposed to the light from the projection optics 55, so that the patterns on the mask M are transferred to the surface of portion of the tape T (step S9).

The controller 10 determines whether or not the misaligned amount (at which the alignment mark of the tape T is misaligned with that of the mask M) falls within the threshold δ (step S10). If the misaligned amount is determined to be less than the threshold δ ("Yes" at the step S10), then this process proceeds to a step S13. Otherwise ("No" at the step S10), it proceeds to a step S11. The typical reason why the misaligned amount has a large value is that the portion of the tape T which is set on the exposure stage 51 is angled with respect to the feeding direction. Therefore, if the feeding amount and angled amount of the tape T are decreased, then the tape T must be fixed on the exposure stage 51a precisely. As long as the tape T is fed precisely, then an amount at which the support unit 54 needs to displace the mask M is small or zero. This leads to the decrease in the throughput of the exposure device 5. For this reason, the controller 10 determines whether or not the misaligned amount falls within the threshold S. If the misaligned amount exceeds it, then the process proceeds to the steps S11 and S12, and the guide rollers 3 and 7 are controlled to decrease the misaligned amount of the tape T.

The controller 10 sends drive signals to the motors M1 and M4 to thereby displace the second supply guide roller 3 and the first take-up guide roller 7 on the rotational axes (step S11).

When the controller 10 rotates the motors M1 and M4, the roller main bodies 31 and 71 are displaced in the directions of the arrow "a" and the tape T is displaced in the directions of the arrow "b" as shown in FIG. 4. If the second supply guide roller 3 and the first take-up guide roller 7 are displaced in the directions of the arrow "a," the portion of the tape T which ranges between the first transfer roller 4 and the second transfer roller 6 moves in the directions of the arrow "c." Consequently, the position of the side edges and the angle of the tape T are corrected.

The controller 10 controls the rotations of the motors M2 and M3, thereby adjusting the feeding amount of the tape T in order to match both alignment marks (step S12).

In addition, since the first and second transfer rollers 4 and 6 have the absorbing mechanisms 42, the tape T does not slip over them. Thus, the tape T is fed accurately. In other words, the transfer device A ensures that the tape T is fed to the exposure stage 51a by displacing the tape T on the rotational axis as well as by changing the feeding amount of the tape T.

The portion of the tape T that has passed through the exposure stage 51a is fed to the take-up slack absorber D2 by the first and second transfer rollers 4 and 6 (step S13). The feeding route is curved at the second transfer roller 6.

In the take-up slack absorber D2, the tension of the tape T is adjusted by the same way as that in the supply slack absorber D1. The tape T fed from the take-up slack absorber D2 is received by the second take-up guide roller 8, and is wound around the take-up reel B2 in the take-up reel rotating section 9 (step S14).

As described above, the transfer device A uses the first and second transfer rollers 4 and 6 to adjust the feeding amount of the tape T on the exposure stage 51a. In addition, the transfer device A uses the second supply guide roller 3 and the first take-up guide roller 7 to adjust the angle of the tape T on the exposure stage 51a. With the transfer device A, an amount at which the controller 10 needs to displace the mask M is decreased greatly. This makes it possible to enhance the throughput of the exposure device 5 and to provide the precise mask alignment process.

In the transfer device A, the tape T is pulled in the direction opposite to the feeding direction, while being fed obliquely downward and upward. Consequently, the looseness of the tape T is optimized. The transfer device A can feed the tape T to the exposure device 5 in the stable condition. With this, circuit patterns on the mask M are transferred to the surface of the tape T precisely. In addition, the tape T having been subjected to the exposure process is wound around the take-up reel B2 in the take-up reel rotating section 9 smoothly.

[Modification of First Embodiment]

Now, a description will be given below, of a transfer device according to a modification of the first embodiment, with reference to FIG. 8. In this description, the same reference numerals are given to the same parts as those already described in the first embodiment, and duplicate description therefor is omitted.

Figure 8:
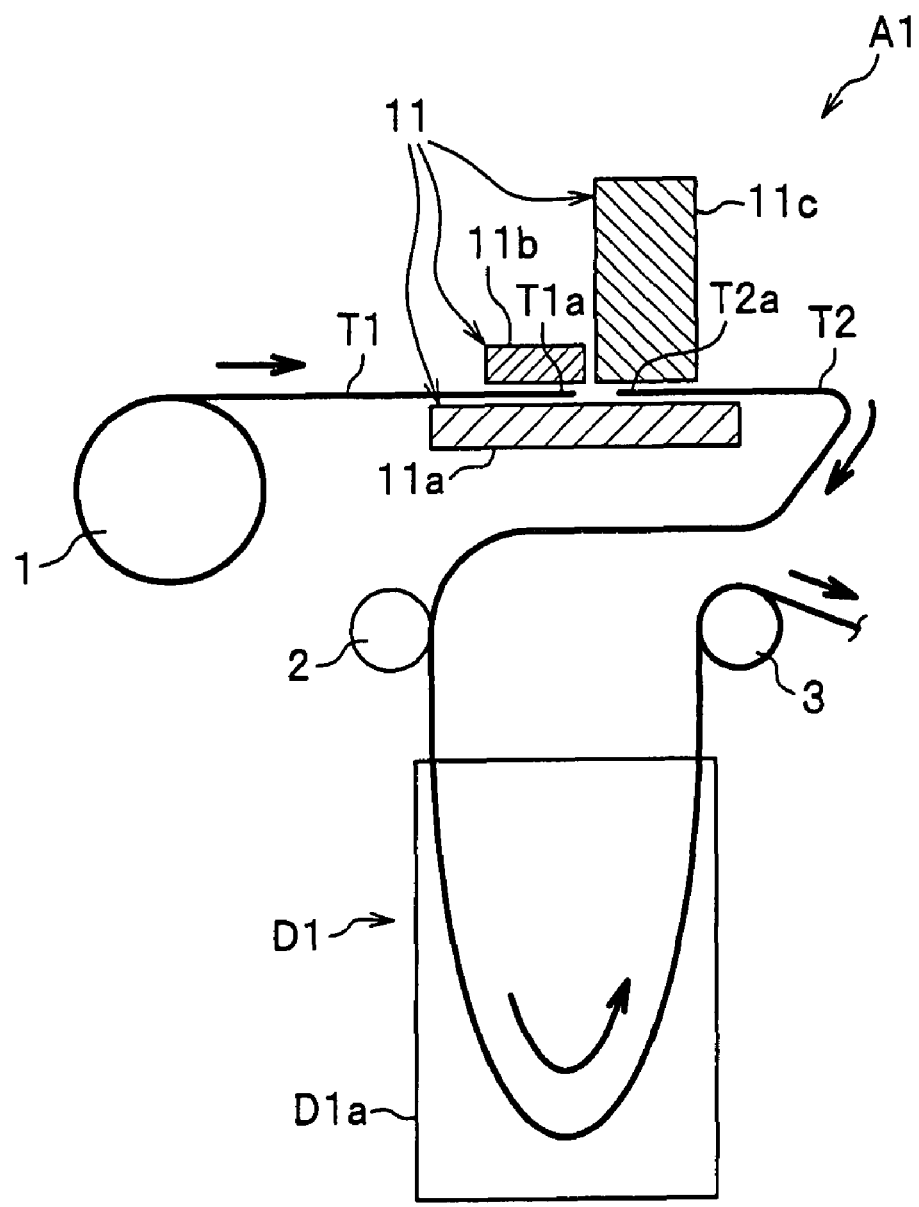
FIG. 8 is partially enlarged schematic view depicting a modification of the transfer device.

Referring to FIG. 8, a transfer device A1 of the modification is equipped with a work connection mechanism 11 on a feeding route between the supply reel rotating section 1 and the first supply guide roller 2. This work connection mechanism 11 is positioned higher than the first supply guide roller 2 and the supply slack absorber D1 As shown in FIG. 8, the work connection mechanism 11 connects a tail end T2a of a tape T2 which is in course of an exposure process on the exposure stage 51a (see FIG. 1) and a front end T1a of a virgin tape T1. This mechanism 11 includes a nonstick stage 11a, a holding unit 11c placed on the stage 11a and for holding the tape T1, and a crimp unit 11b for thermally crimping the tapes T1 and T2.

A way to connect the tapes T1 and T2 will be described. When the tape T2 is about to run-out, then an operator stops the operation of the transfer device A1. An operator sets the tail end T2a of the tape T2 on the center of the stage 11a. Note that the stage 11a, which is positioned above the supply slack absorber D1, is arranged close to the first supply guide roller 2 around which the processed tape T2 is wound. This arrangement enables the connection of the tapes T1 and T2 to be facilitated.

After setting the tail end T2a, an operator presses it down by using the holding unit 11c. An operator overlaps the tail end T2a of the tape T2 and the front end T1a of the tape T1. Then, the overlapped portions are connected by a thermal crimping process. With this work connection mechanism 11, the tapes T1 and T2 are connected, thereby improving the efficiency of the exposure process.

[Additional Modification]

The supply slack absorber D1 and the take-up slack absorber D2 as shown in FIGS. 1 and 2 may be implemented by any members as long as the tension of the tape T can be adjusted. For example, each of them may be an air dancer provided with a box (D1a) through which the tape T is to passes and a fan for blowing air toward an opening of the box, thereby loosing the tape T within the box in a U shape.

Alternatively, each of the absorbers D1 and D2 may be a roller dancer in which a roller is placed on the tape T. In this case, since the weight of the roller is applied to the tape T, the tape T is pulled in the direction opposite to the feeding direction, so that the tape T is loosened in a U shape.

In the first embodiment, the motors M2 and M3 are installed in the first and second transfer rollers 4 and 6, respectively. However, the present invention is not limited to this configuration. Alternatively, every roller and reel may have its own motor. In other words, each of the supply reel rotating section 1, first supply guide roller 2, second supply guide roller 3, first take-up guide roller 7, second take-up guide roller 8 and take-up reel rotating section 9 may have its own motor. In this configuration, the supply reel rotating section 1 can feed the tape T more smoothly, and the take-up reel rotating section 9 can wind it more smoothly.

In the first embodiment, each of the first and second transfer rollers 4 and 6 is provided with the absorbing holes 41b or 61b and the absorbing mechanism 42 or 62. However, the present invention is not limited to this configuration. Alternatively, each of the first and second guide rollers 2 and 3 and the first and second take-up guide rollers 7 and 8 may have the absorbing holes and absorbing mechanism. With this configuration, the tape T can be fed more smoothly.

The process stage 51 may not exclusively be applied to the exposure device 5. For example, it may be applied to an inspection device for the tape T, a hoop forming device or any other machines. If the process stage 51 is applied to a hoop forming device, then the take-up reel rotating section 9 may be replaced by a cutting unit.

[Second Embodiment]

Next, a description will be given blow, of a transfer device according to a second embodiment of the present invention, with reference to FIGS. 9 to 12.

Figure 9:
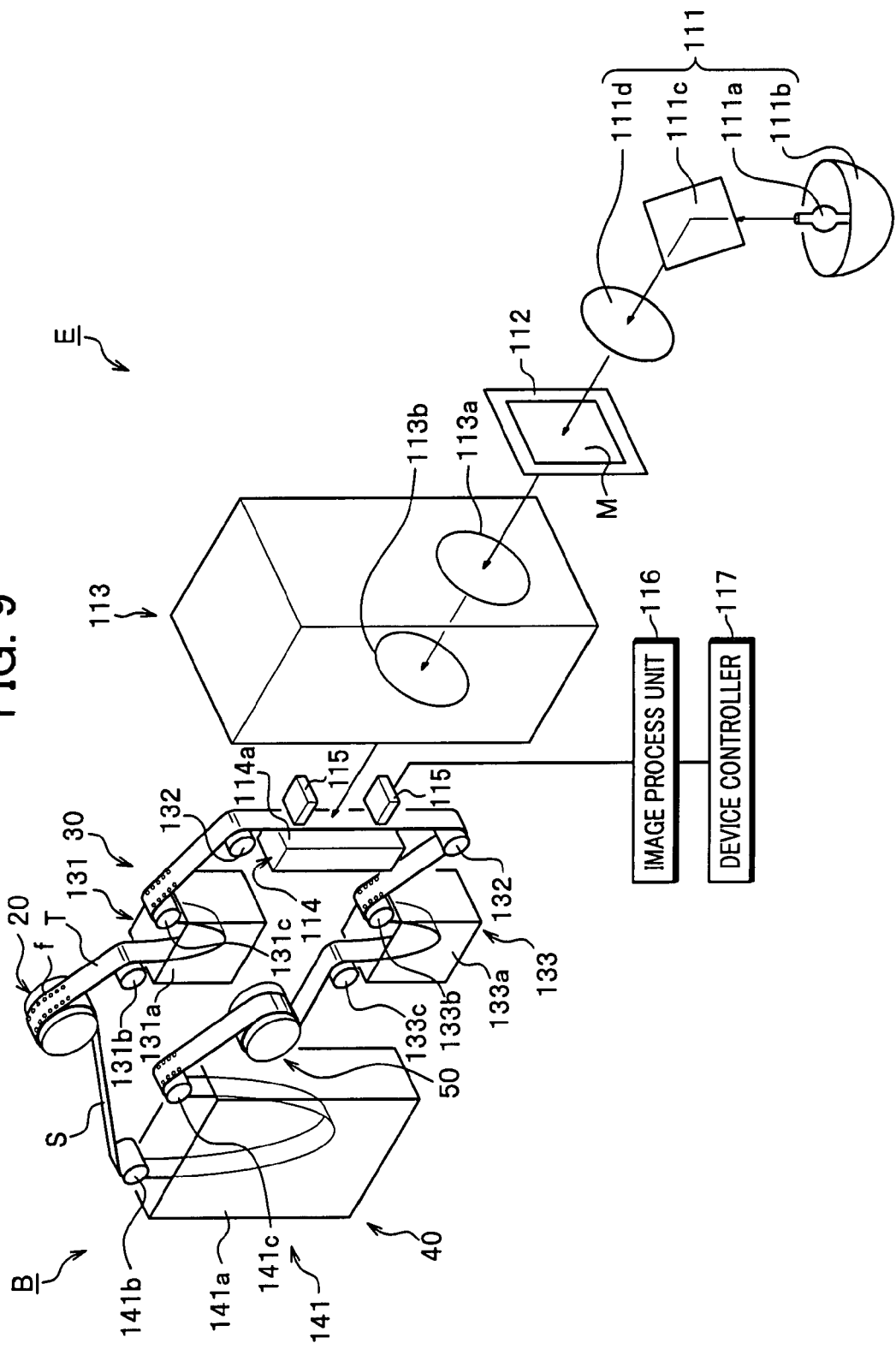
FIG. 9 is a perspective view depicting a transfer device according to a second embodiment of the present invention and a corresponding exposure device.

Referring to FIG. 9, a transfer device B according to a second embodiment of the present invention is configured to send only the tape T out of a tape T and a protective sheet S to an exposure stage 114 of an exposure device E. An explanation will be given below, of the tape T, protective sheet S and exposure device E in this order.

[Structures of Tape T and Protective Sheet S]

The tape T is a film-shaped board. It is to be subjected to exposure, washing, etching and inspection processes, and to be used for an electric circuit board. In this embodiment, the tape T undergoes an exposure process in an exposure device E. However, the tape T is not limited to an object for an exposure process. Alternatively, it may be an object for any other processes. The tape T is, for example, 250 mm wide, 25 µm thin and 200 m long. In addition, it may have perforations on both sides.

The protective sheet S is made of a thin paper, and is used to protect the surface of the tape T. The size of the protective sheet S is similar to that of the tape T.

[Structure of Exposure Device E]

The exposure device E is aimed at transferring patterns on a mask M to the surface of the Tape T for each block.

The exposure device E is constituted by:
an optical source system 111;
a mask holding frame 112 for holding the mask M on the optical axis of the optical source system 111;
a projection optics 113 located a predetermined distance away from the mask holding frame 112; and
an exposure stage 114 located on the optical axis of the projection optics 113.

Furthermore, the exposure device E includes image pickup units 115 used for aligning alignment marks on the tape T and on the mask M, an image process unit 116 for giving the captured marks to an image process, and a device controller 117.

The optical source system 111 emits light of predetermined wavelength, containing ultraviolet light. The optical source system 111 is composed of a lamp 111a, an elliptic mirror 111b for covering the bottom surface of the lamp 111a, a reflector 111c for curving the path of the light reflected from the elliptic mirror 111b, and a lens 111d for adjusting the illumination distribution of the light reflected from the reflector 111c.

The mask holding frame 112 is adapted to support the mask M in an upright position so as to face the projection optics 113. This frame 112 has a drive mechanism for displacing the mask M in the directions perpendicular to the optical axis of the projection optics 113. The mask M has circuit patterns printed thereon, and these patterns are to be projected to the surface of the tape T. In addition, the mask M has the alignment mark and identification mark at respective predetermined locations.

The projection optics 113 has an input side converging lens 113a and an output side converging lens 113b. The individual centers of lens and the optical axis are aligned. When light enters the projection optics 113, the light passes through both lens 113a and 113b, and irradiates the surface of the tape T. Note that an optical system of the present invention is not limited to the projection optics 113 of this embodiment.

The exposure stage 114 is positioned a predetermined distance away from the projection optics 113, and has a stage surface 114a extending perpendicular to the optical axis of the light from the projection optics 113. Because of this arrangement, the lateral length of the transfer system B can be shortened, so that it is made compact. The exposure stage 114 is coupled to a pipe of a vacuum pump (not shown). This vacuum pump sucks the tape T, so that the tape T is fixed on the exposure stage 114. The tape T is fed to the exposure stage 114 for each block. Then, the alignment mark on the tape T is registered with that on the mask M. Finally, the patterns on the mask M are transferred to the surface of the tape M.

The image pick-up units 115 are aimed at capturing the images of alignment marks on the tape T and on the mask M, and each of them includes a half mirror and a CCD camera. The image pick-up units 115 are moved away from the optical axis and fixed there, while the tape T is exposed to the light.

The image process unit 116 sends data on the images from the image pick-up units 115 to the device controller 117. The device controller 117 controls a guide roller 131c, stage guide rollers 132, 132 and a guide roller 133b, based on the image data, so that the alignment marks on the mask M and on the tape T are aligned. The device controller 117 also controls the drive mechanism of the mask holding frame 112. In addition, the device controller 117 controls a guide roller 141c of a protective sheet transfer system 40. Therefore, the protective sheet S is displaced on the rotational axis, so that the protective sheet S and the tape T are aligned.

[Structure of Transfer Device B]

Now, a structure of the transfer device B will be described is blow. In the following description, orientations correspond to those in FIG. 10.

Figure 10:
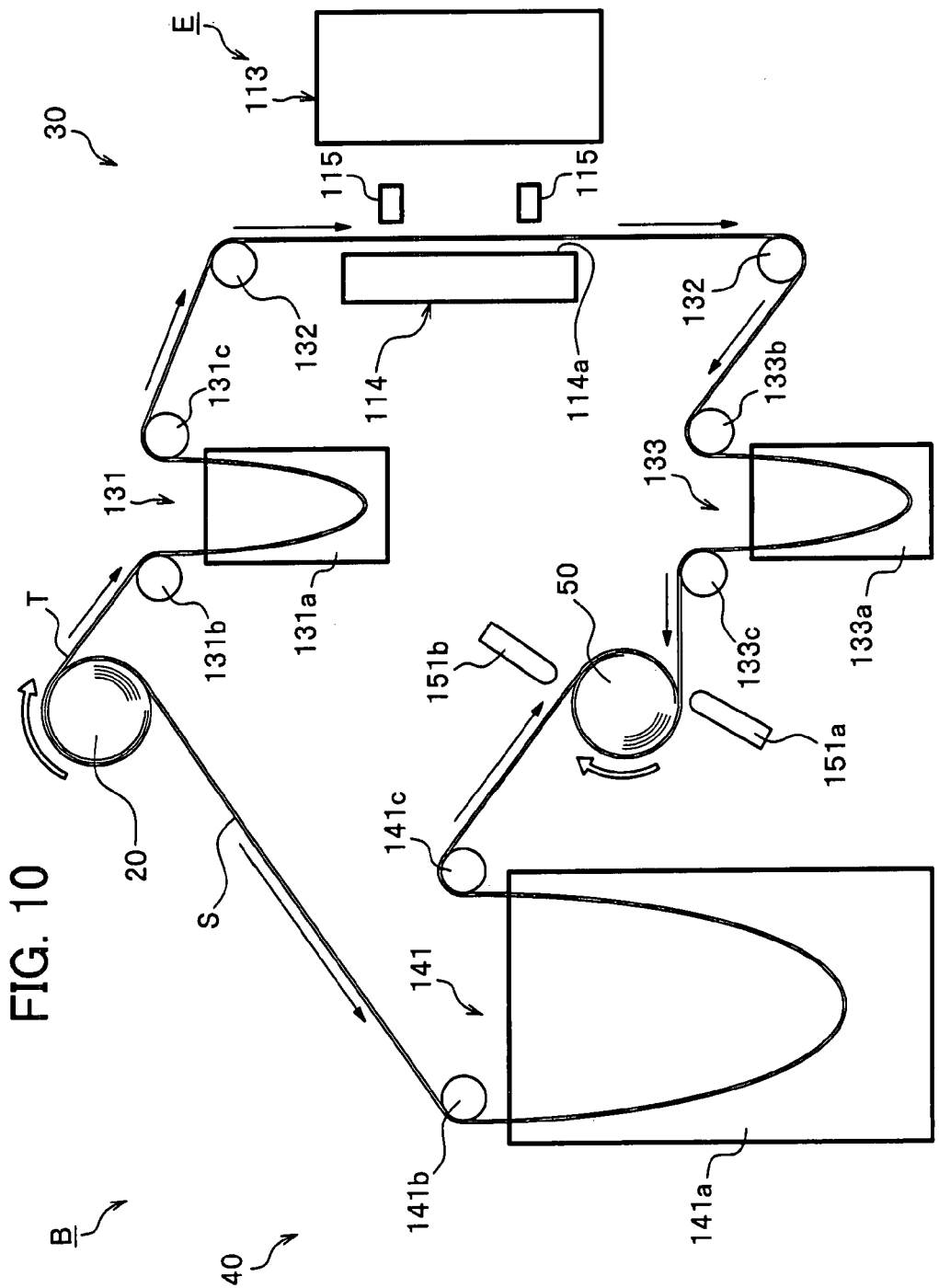
FIG. 10 is a partially schematic view depicting the transfer device and the exposure device.

Referring to FIGS. 9 and 10, the transfer device B includes a supply reel 20, a tape transfer system 30 for forwarding the tape T, a protective sheet transfer system 40 for forwarding the protective sheet S, and a take-up reel 50.

(Supply Reel 20)

The supply reel 20 has the tape T wound therearound, and the protective sheet S is put on the tape T. The supply reel 20 is, for example, 600 mm in diameter. The supply reel 20 rotates clockwise in response to the rotation of a drive shaft (not shown) driven by a motor. The tape T and the protective sheet S are fed from the supply reel 20 to the take-up reel 50 through different transfer systems, respectively.

(Tape Transfer System 30)

Referring to FIG. 10, the tape transfer system 30 feeds the tape T from the supply reel 20 to the take-up reel 50. Near a predetermined spot of this transfer route, the exposure device E is installed. The tape transfer system 30 includes a first tension adjuster 131 provided between the supply reel 20 and the exposure device E, a pair of stage guide rollers 132, 132 for guiding the tape T to the exposure stage 114 of the exposure device E, and a second tension adjuster 133 provided between the exposure device E and the take-up reel 50.

The first tension adjuster 131 is placed on the lower right of the supply reel 20. It includes the guide rollers 131b, 131c, and a second air dancer 131a provided therebetween. The second air dancer 131a has a box shape, and contains the slack of the tape T between the guide rollers 131b, 131c, so that the tension of the tape T to be fed toward the exposure device E is adjusted. As a result, the excess tension or looseness of the tape T is prevented. The guide roller 131c may be able to be displaced on its rotational axis for the purpose of feeding the tape T to the exposure stage 114 precisely.

The stage guide rollers 132, 132 are arranged above and below the exposure stage 114, respectively, and they guide the tape T to the stage surface 114a of the exposure stage 114 in an exposure device E. The tape T is fed downward between the stage guide rollers 132, 132 and along the stage surface 114a. The upper stage guide roller 132 is located on the lower right of the guide roller 131c. The stage guide rollers 132, 132 need to feed the tape T to the exposure stage 114 precisely, and to prevent the tape T from slipping over the rollers. Accordingly, it is preferable that each of the stage guide rollers 132, 132 has a vacuum suction mechanism. In addition, it is preferable that the stage guide rollers 132, 132 are made of resin such as ABS (acrylnitrile-butadiene-styrene copolymer). In this case, slight vibrations of the tape T are absorbed by the rollers.

As shown in FIG. 10, the second tension adjuster 133 is located under the first tension adjuster 131, and includes guide rollers 133b, 133c and a third air dancer 133a for adjusting the tension of the tape T between the rollers 133b, 133c. The third air dancer 133a has a box shape, where a portion of the tape T which ranges between the guide rollers 133b, 133c is slackened in a U shape due to its weight. This is how the tension of the tape T is adjusted. As a result, the tape T does not undergo excess loads or is not loosened greatly. The guide roller 133b is located on the higher left of the lower stage guide roller 132. The guide roller 133b may be displaced on its rotational axis for the purpose of feeding the tape T more precisely. If the guide roller 133b is displaced in conjunction with the guide roller 131c, then the misaligned amount and angle of the tape T can be corrected.

(Protective Sheet Transfer System 40)

The protective sheet transfer system 40 is configured to feed the protective sheet S downward and in the different direction (left) from that in which the tape transfer system 30 forwards the tape T from the supply reel 20. Further, the protective sheet transfer system 40 is adapted to forward the protective sheet S separately from the tape T. Hence, even if contaminants are adhered to the surface of the protective sheet S, the contaminants never fly to the exposure stage 114 of the exposure device E in the tape transfer system 30. The protective sheet transfer system 40 feeds the protective sheet S from the supply reel 20 to the take-up reel 50, and is equipped with a third tension adjuster 141.

The third tension adjuster 141 is located on the lower left of the supply reel 20, and it includes a pair of guide rollers 141b, 141c, and a first air dancer 141a for adjusting the tension of the protective sheet S between the guide rollers 141b, 141c. The first air dancer 141a has a box shape, where a portion of the protective sheet S that ranges between the guide rollers 141b, 141c is slackened due to its weight. As a result, the tension of the protective sheet S is adjusted. This prevents the protective sheet S from undergoing excess loads or from being loosened greatly. The slack length of the protective sheet S within the first air dancer 141a is longer than that of the tape T in the second or third air dancer 131a or 133a. The guide roller 141b is located on the lower left of the supply reel 20, and the guide roller 141c is located on the higher left of the take-up reel 50. The protective sheet transfer system 40 may have some other guide rollers.

(Structure of Guide Roller 141c)

Figure 11:
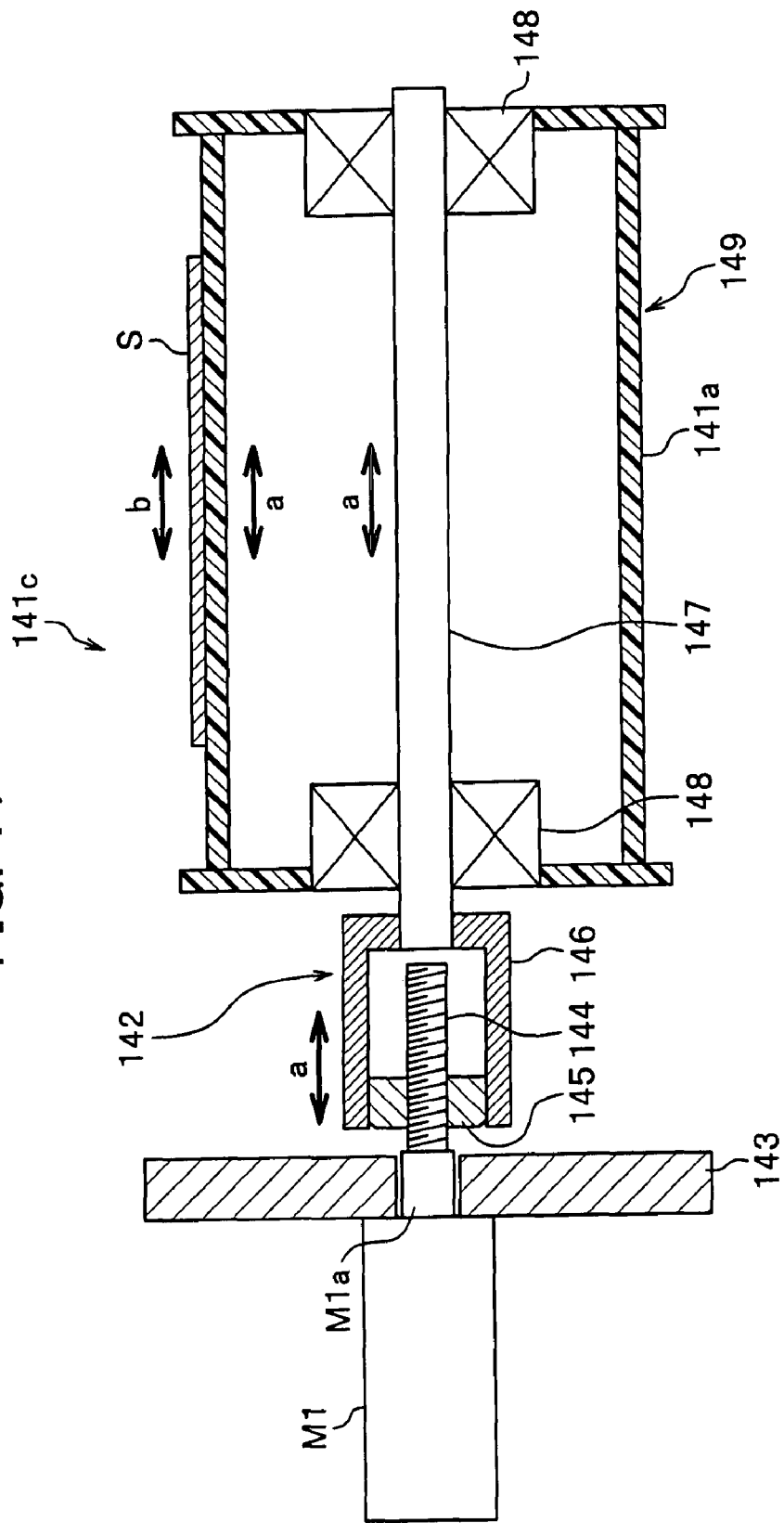
FIG. 11 is a cross-section view depicting the guide roller of a transfer device.

Referring to FIG. 11, the guide roller 141c is adapted to forward the protective sheet S from the first air dancer 141a to the take-up reel 50 (see FIG. 10), and has a work position adjuster 142 for displacing the protective sheet S in the directions of an arrow "b." The guide roller 141c includes a rotatable roller main body 149 for forwarding the protective sheet S, a nut 145 displaced on the rotational axis of the roller main body 149 in response to the rotation of a ball screw 144, a spline axis 146 displaced in conjunction with the nut 145, a shaft 147 displaced in conjunction with the spline axis 146, and bearings 148 arranged between the shaft 147 and the roller main body 149.

The work position adjuster 142 displaces the roller main body 149 on the rotational axis, thereby adjusting the position of the protective sheet S on the process stage 151. This work position adjuster 142 includes a motor M1, the ball screw 144, the nut 145, the spline axis 146 and the shaft 147.

The motor M1 as shown in FIG. 11 rotates clockwise or counterclockwise in response to control signals from the device controller 117. Then, the roller main body 149 is displaced in the directions of an arrow "a" while rotating. In response, the protective sheet S on the roller main body 149 is displaced in the directions of the arrow "b." A rotational amount of the motor M may be determined based on a signal from a first sensor 151a which senses the position of side edges of the tape T and/or a signal from a second sensor 151b which senses the position of side edges of the protective sheet S. The casing 143 holds the motor M1, and is fixed at a predetermined location. In addition, the motor shaft M1a penetrates the casing 143. The guide roller 141c is held at a predetermined location by the casing 143.

The ball screw 144 is coupled to the motor shaft M1a of the motor M1, and rotates in conjunction with it. Note that between the ball screw 144 and the motor shaft M1a, a reduction gear mechanism may be provided. The nut 145 mates with the ball screw 144. The nut 145 is contained in the spline shaft 146, and is displaced in the directions of the arrow "a" while the ball screw 144 is rotating.

The spline shaft 146 as shown in FIG. 11 mates with the nut 145, and is displaced in the directions of the arrow "a" while rotating in conjunction with the nut 145. One end of the shaft 147 is coupled to the spline shaft 146. In addition, the shaft 147 has bearings 148 at both ends, and is displaced on the rotational axis in conjunction with the spline axis 146 while rotating. The roller main body 149 is displaced in the directions of the arrow "a" in conjunction with the, bearings 148, and has a bobbin shape with flanges. The roller surface 141a of the roller main body 149 is made of synthetic resin so as to absorb slight vibrations.

As described above, once the motor M1 rotates, the roller main body 149 is displaced on the rotational axis in conjunction with the ball screw 144, spline shaft 146, shaft 147 and shaft 148. In this way, the side edges of the protective sheet S can be adjusted. The guide roller 141c can adjust the position of the protective sheet S with respect to the position of the tape T precisely.

The structure of the guide roller 141c is not limited to that shown in FIG. 11. Alternatively, the motor M1 rotates the shaft 147 only, and the guide roller 141c is rotated by a different motor or a linear slide mechanism (not shown). Both the guide rollers 131c and 133b may be the same structure as that of the guide roller 141c.

(Take-up Reel 50)

The take-up reel 50 is placed on one side of the exposure stage 114 and below the supply reel 20. This arrangement makes it possible to shorten the lateral length of the transfer device B, thereby making it compact. The take-up reel 50 is rotated clockwise by a motor. Thus, the take-up reel 50 winds the tape T forwarded by the tape transfer system 30 and the protective sheet S forwarded by the protective sheet transfer system 40.

The tape T and the protective sheet S that are to be wound by the take-up reel 50 are adjusted to have the same tension by the second tension adjuster 133 and the third tension adjuster 141, respectively. Accordingly, the cross-section of the take-up reel 50 around which both the tape T and the protective sheet S are wound has a shape of a substantially perfect circle. Each of the transfer routes of the tape T and the protective sheet S makes up a closed loop through the supply reel 20 and take-up reel 50. Therefore, this structure does not need a take-up reel dedicated for the protective sheet.

Close to the take-up reel 50, the first sensor 151a for sensing the position of side edge of the tape T and the second sensor 151b for sensing the position of side edges of the protective sheet S may be provided. If the tape T and the protective sheet S are misaligned on the take-up reel 50 along the rotational axis, then the tape T is likely to be damaged, or contaminants may be adhered to the surface of the tape T. Hence, the first sensor 151a and second sensor 151b sense the positions of side edges of the tape T and the protective sheet S, respectively. Then, their edge positions are adjusted precisely by displacing the guide roller 141c on its rotational axis based on the sensing result.

[Operations of Exposure Device E and Transfer Device B]

A description will be given below, of operations of the exposure device E and the transfer device B with reference to the transfer routes of the tape T and the protective sheet S.

First, an operator sets the supply reel 20 around which both the tape T and the protective sheet S are wound and the empty take-up reel 50 to the transfer device B. The supply reel 20 forwards the tape T toward the tape transfer system 30 as well as the protective sheet S toward the protective sheet transfer system 40.

The tape T fed from the supply reel 20 is forwarded to the first tension adjuster 131. The first tension adjuster 131 feeds the tape T in the right direction by using the guide rollers 131b, 131c, while the second air dancer 131a is adjusting the tension of the tape T. Following this, the adjuster 131 feeds the tape T toward the exposure device E. The second air dancer 131a maintains the tension of the tape T in balance on the upstream side of the exposure device E.

In the tape transfer system 30, the feeding route of the tape T is curved at the stage guide rollers 132, 132. The tape T is fed downward therebetween. The tape transfer system 30 feeds the tape T for each block which is to be processed by the exposure device E once. The tape transfer system 30 controls the stage guide rollers 132, 132 individually, so that the position of the tape T is adjusted. If the tape T has a thin, wide shape, then the feeding speed of the tape T for each block is likely to be varied. This makes it difficult to position the tape T precisely. However, in this embodiment, such a disadvantage is prevented by adjusting the tension of the tape T within the first tension adjuster. If the tape T is angled on the exposure stage 114, then the system 30 displaces the guide rollers 131c and 133b on their rotational axes. This enables the adjustment of the angle of the tape T.

The system 30 positions the tape T on the exposure stage 114 of the exposure device E and, then fixes it. Following this, the exposure device E irradiates the surface of the tape T with light. After the exposure process, the system 30 forwards the processed portion of the tape T to where it is not affected by a next exposure process.

The lower stage guide roller 132 and the guide roller 133b guide the tape T. The feeding route of the tape T is curved at the stage guide roller 132. The guide rollers 133b, 133c guide the tape T in the left direction and over the second tension adjuster 133, while the third air dancer 133a is adjusting the tension of the tape T. Finally, the take-up reel 50 winds the tape T. While take-up reel 50 is winding the tape T, the first sensor 151a may sense the position of side edges of the tape T.

On the other hand, the supply reel 20 forwards the protective sheet S to the third tension adjuster 141. The feeding route of the protective sheet S is curved at the guide roller 141b, and the protective sheet S is fed in the right direction. The first air dancer 141a adjusts the tension of the protective sheet S and, then feed it to the take-up reel 50. While the take-up reel 50 is winding the protective sheet S, the second sensor 151b may sense the position of side edges of the protective sheet S. The device controller 117 sends control signals to the motor M1 of the guide roller 141c in order to align the side edges of the protective sheet S with those of the tape T. When the guide roller 141c is displaced on the rotational axis, the protective sheet S is also displaced on the rotational axis. Finally, the take-up reel 50 winds the displaced protective sheet S and the tape T.

In this way, the take-up reel 50 winds both the protective sheet S and the tape T which have the same tension. Thus, they are wound in balance. When the exposure device E gives an exposure process to the tape T or when the protective sheet S is put on the tape T, the tension of the tape T used to be varied. However, the transfer device E of the second embodiment uses the second tension adjuster 133 to maintain the tension of the tape T. Therefore, the transfer device E can feed the tape T in the stable condition. Consequently, the cross-section of the take-up reel 50 around which both the tape T and the protective sheet S are wound is perfectly circular, and both edges of the tape T and those of the protective sheet S are aligned. Furthermore, since the tension of the protective sheet S is adjusted by the third tension adjuster 141, this adjustment process does not affect feeding of the tape T.

In the transfer device B of the second embodiment, the different transfer systems (tape transfer system 30 and protective sheet transfer system 40) feed the tape T and the protective sheet S, separately. Therefore, no any accessory members are required.

The supply reel 20 and the take-up reel 50 are arranged on one side of the exposure stage 114. This arrangement enables the lateral length of the transfer device E to be shortened, thereby making the device compact.

The protective sheet transfer system 40 is located on the side opposite to the tape transfer system 30 with respect to the supply reel 20. Thus, even if contaminants are adhered to the surface of the protective sheet S, the contaminants are less likely to fly to the tape transfer system 30.

The exposure device E gives an exposure process to the tape T of which tension has been adjusted. It is therefore possible to conduct the stable, accurate exposure process. The tensions of the tape T and the protective sheet S are kept the same by the second and third tension adjusters 133 and 141, respectively. Therefore, the take-up reel 50 can wind them in balance.

The tape transfer system 30 and the protective sheet transfer system 40 are provided independently. Hence, even if the protective sheet S is cut accidentally, feeding of the tape is T is not affected. This makes it possible to improve the reliability of the tape T.

Up to this point, the transfer device B of the second embodiment has been described. However, the present invention is not limited to this second embodiment. Needless to say, various modifications and variations of the embodiment may be allowed.

Figure 12A:
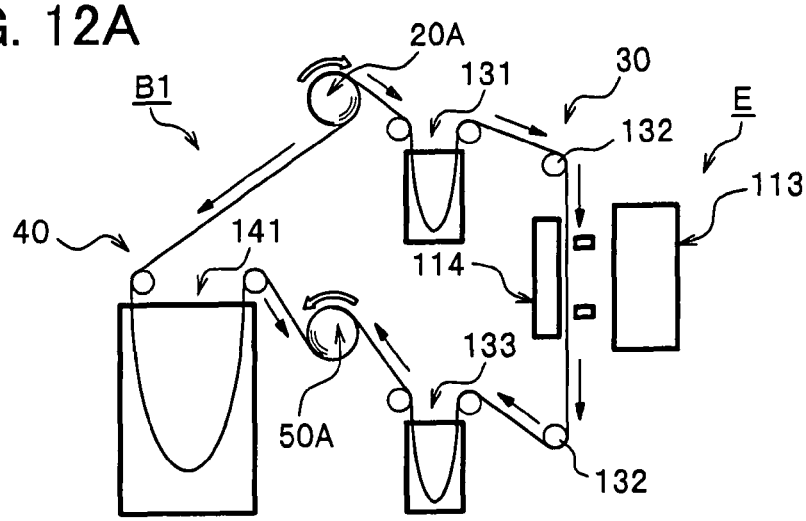
FIG. 12A is a schematic view depicting a modification of the transfer device and the exposure device.
Figure 12B:
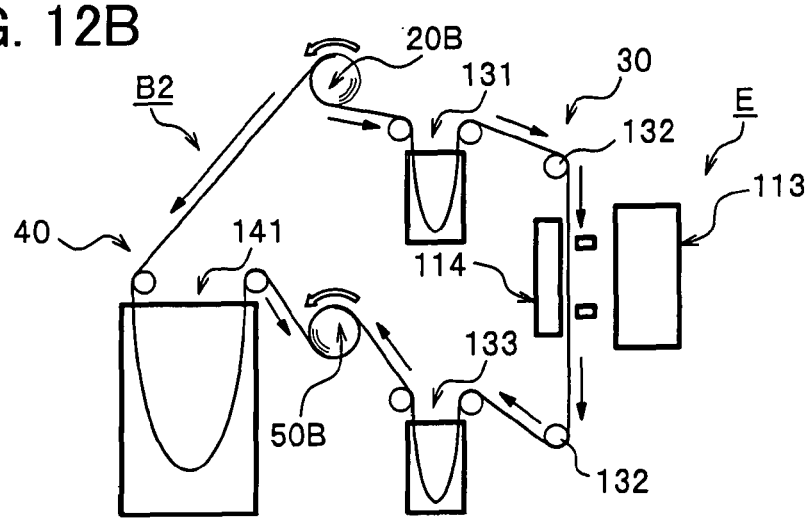
FIG. 12B is a schematic view depicting another modification of the transfer device and the exposure device.
Figure 12C:
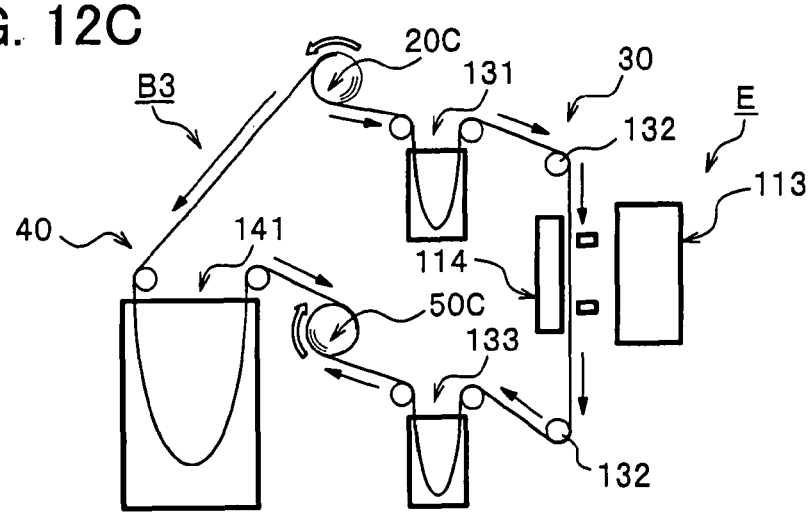
FIG. 12C is a schematic view depicting still another modification of the transfer device and the exposure device.
Figure 13:
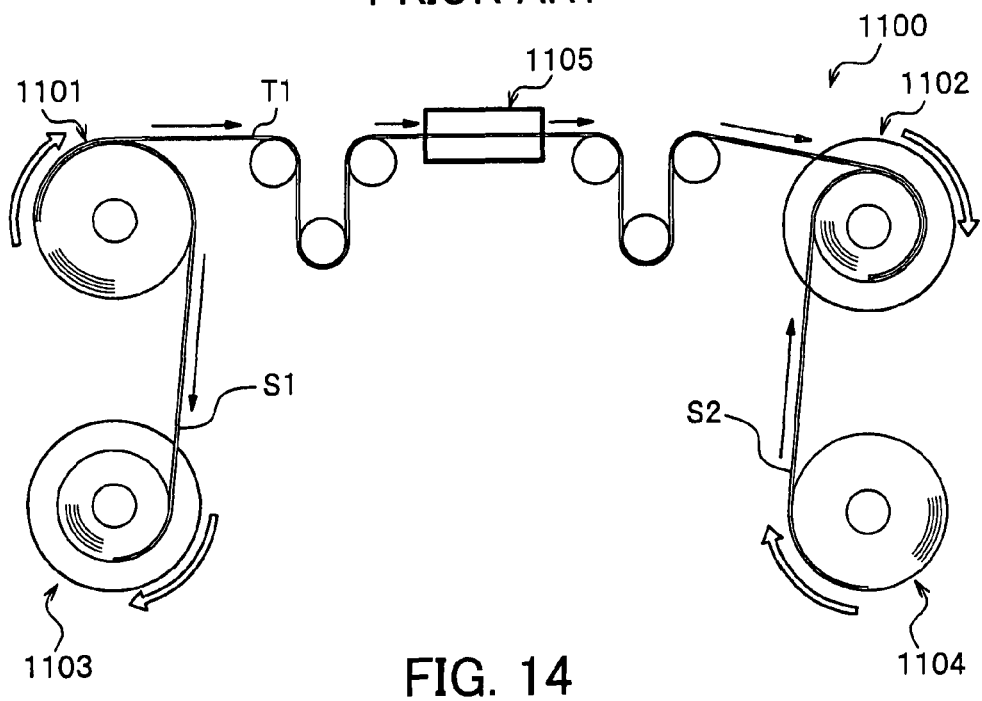
FIG. 13 is a schematic view depicting a transfer device of prior art.
Figure 14:
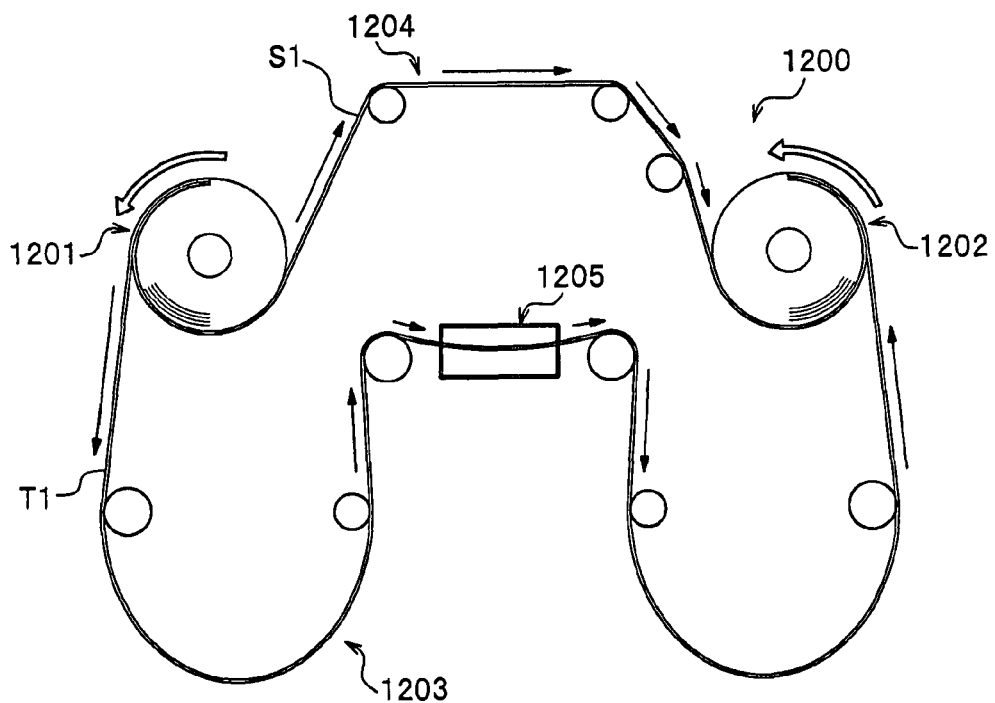
FIG. 14 is a schematic view depicting another transfer device of prior art.

FIGS. 12A to 12C show a modification of the transfer device and the exposure device of the second embodiment. In the transfer device B of the second embodiment, the supply reel 20 and the take-up reel 50 rotate clockwise (see FIG. 10). However, the present invention is not limited to this configuration.

Referring to FIG. 12A showing a transfer device B1, a supply reel 20A rotates clockwise, while the take-up reel 50A rotates counterclockwise.

Referring to FIG. 12B showing a transfer device B2, both a supply reel 20B and a take-up reel 50B rotate counterclockwise.

Referring to FIG. 12C showing a transfer device B3, a supply reel 20C rotates counterclockwise, while a take-up reel 50C rotates clockwise.

In the transfer device B of the second embodiment, the guide roller 131c, guide roller 133b and guide roller 141c can be displaced on their rotational axes. However, the present invention is not limited to this configuration. Alternatively, any of the other rollers may be displaced as well.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. A transfer device for feeding a tape-shaped work to a process stage arranged along a vertical direction in which the work is fed vertically, the transfer device being located on one side of the process stage, said transfer device comprising:
    a supply reel around which the work and a protective sheet for covering a surface of the work are wound, the supply reel for feeding the work to the process stage and feeding the protective sheet to a different direction from the process stage;
    a take-up reel located lower than the supply reel;
    the take-up reel winding the work being processed in the process stage and the protective sheet that have been fed from the supply reel;
    a work feeding mechanism for feeding the work from the supply reel to the take-up reel through the process stage; and
    a protective sheet feeding mechanism for feeding the protective sheet from the supply reel to the take-up reel;
    the protective sheet feeding mechanism having a first roller located lower than the supply reel and a second roller located higher than the take-up reel, for guiding the protective sheet from the supply reel to the take-up reel, and a first air dancer for adjusting a tension of the protective sheet to be fed to the take-up reel;
    the first air dancer being located between the first roller and the second roller;
    the work feeding mechanism having a third roller and a fourth roller for guiding the work to the process stage from the take-up reel, and a second air dancer which adjusts a tension of the work between the third roller and the fourth roller;
    the work feeding mechanism having a fifth roller and a sixth roller for guiding the work fed from the process stage to the take-up reel, and a third air dancer which adjusts a tension of the work between the fifth roller and the sixth roller;
    the fifth roller, the sixth roller and the third air dancer being located lower than the take-up reel;
    the third air dancer being located below the second air dancer;
    wherein the work and the protective sheet are wound around the take-up reel in balance by adjusting the tension of the work and the tension of the protective sheet with the third air dancer and the first air dancer, respectively.

2. The transfer device according to claim 1, further comprising:
    a first sensor for sensing a position of side edges of the work fed from the process stage to the take-up reel, and a second sensor for sensing a position of side edges of the protective sheet fed from the supply reel to the take-up reel,
    wherein the side edges of the work are aligned with those of the protective sheet, based on sensing results of the first and second sensors, and the work and the protective sheet are then wound by the take-up reel.

* * * * *